US006812165B2

United States Patent
Sato et al.

(10) Patent No.: US 6,812,165 B2
(45) Date of Patent: Nov. 2, 2004

(54) MANUFACTURING METHOD OF SEMICONDUCTOR INTEGRATED CIRCUIT DEVICE

(75) Inventors: Hidenori Sato, Ome (JP); Yoshiyuki Hayashi, Hino (JP); Toshio Ando, Kunitachi (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/642,658

(22) Filed: Aug. 19, 2003

(65) Prior Publication Data

US 2004/0038494 A1 Feb. 26, 2004

Related U.S. Application Data

(63) Continuation of application No. 09/905,887, filed on Jul. 17, 2001, now Pat. No. 6,632,750.

(30) Foreign Application Priority Data

| Jul. 31, 2000 | (JP) | ......................................... 2000-232191 |
| Oct. 31, 2000 | (JP) | ......................................... 2000-332863 |

(51) Int. Cl.[7] .................... H01L 21/31; H01L 21/469
(52) U.S. Cl. ..................................... 438/791; 438/762
(58) Field of Search ............................. 438/761, 762, 438/791

(56) References Cited

U.S. PATENT DOCUMENTS

| 4,489,101 A | 12/1984 | Shibata ........................ 427/39 |
| 4,576,678 A | 3/1986 | Shibata ....................... 156/643 |
| 4,940,851 A | 7/1990 | Oyobe et al. ................. 501/56 |
| 6,118,145 A | 9/2000 | Egawa ........................ 257/296 |
| 6,235,416 B1 | 5/2001 | Konig et al. ................. 428/701 |
| 6,268,295 B1 | 7/2001 | Ohta et al. .................. 438/735 |
| 6,337,272 B1 | 1/2002 | Hamanaka ................... 438/651 |
| 2002/0047150 A1 | 4/2002 | Tokunaga et al. ........... 257/297 |

FOREIGN PATENT DOCUMENTS

| GB | 2 108 756 | 5/1983 |
| JP | 11-16999 | 1/1999 |
| JP | 11-17147 | 1/1999 |

*Primary Examiner*—Amir Zarabian
*Assistant Examiner*—Pamela E. Perkins
(74) *Attorney, Agent, or Firm*—Miles & Stockbridge P.C.

(57) ABSTRACT

Described is a manufacturing method of a semiconductor integrated circuit device by depositing a silicon nitride film to give a uniform thickness over the main surface of a semiconductor wafer having a high pattern density region and a low pattern density region. This is attained by, upon depositing a silicon nitride film over a substrate having a high gate-electrode-pattern density region and a low gate-electrode-pattern density region by using a single-wafer cold-wall thermal CVD reactor, setting a flow rate ratio of ammonia ($NH_3$) to monosilane ($SiH_4$) greater than that upon deposition of a silicon nitride film over a flat substrate.

10 Claims, 19 Drawing Sheets

FIG. 13

| | A<br>ANNEALING TIME OF NH₃ (sec.) | B<br>WALL TEMP. (°C) | C<br>DISTANCE BETWEEN ELECTRODES | D<br>FILM FORMING PRESSURE (Torr) | E<br>FILM FORMING TEMPERATURE (°C) | F<br>N₂ FLOW RATE (sccm) | G<br>NH₃ FLOW RATE (sccm) | H<br>SiH₄ FLOW RATE (sccm) |
|---|---|---|---|---|---|---|---|---|
| | A | B | C | D | E | F | G | H | | | | | | | | | |
| TM9  | 1 | 1 | 1 | 1 | 1 | 1 | 1 | 1 | 0  | 25 | 500 | 200 | 700 | 5000 | 1000 | 20 |
| TM7  | 1 | 1 | 2 | 2 | 2 | 2 | 2 | 2 | 0  | 25 | 550 | 275 | 750 | 7000 | 3000 | 45 |
| TM11 | 1 | 1 | 3 | 3 | 3 | 3 | 3 | 3 | 0  | 25 | 600 | 350 | 800 | 9000 | 5000 | 70 |
| TM5  | 1 | 2 | 1 | 1 | 2 | 2 | 3 | 3 | 0  | 30 | 500 | 200 | 750 | 7000 | 5000 | 70 |
| TM1  | 1 | 2 | 2 | 2 | 3 | 3 | 1 | 1 | 0  | 30 | 550 | 275 | 800 | 9000 | 1000 | 20 |
| TM3  | 1 | 2 | 3 | 3 | 1 | 1 | 2 | 2 | 0  | 30 | 600 | 350 | 700 | 5000 | 3000 | 45 |
| TM15 | 1 | 3 | 1 | 2 | 1 | 3 | 2 | 3 | 0  | 35 | 500 | 275 | 700 | 9000 | 3000 | 70 |
| TM17 | 1 | 3 | 2 | 3 | 2 | 1 | 3 | 1 | 0  | 35 | 550 | 350 | 750 | 5000 | 5000 | 20 |
| TM13 | 1 | 3 | 3 | 1 | 3 | 2 | 1 | 2 | 0  | 35 | 600 | 200 | 800 | 7000 | 1000 | 45 |
| TM12 | 2 | 1 | 1 | 3 | 3 | 2 | 2 | 1 | 60 | 25 | 500 | 350 | 800 | 7000 | 3000 | 20 |
| TM10 | 2 | 1 | 2 | 1 | 1 | 3 | 3 | 2 | 60 | 25 | 550 | 200 | 700 | 9000 | 5000 | 45 |
| TM8  | 2 | 1 | 3 | 2 | 2 | 1 | 1 | 3 | 60 | 25 | 600 | 275 | 750 | 5000 | 1000 | 70 |
| TM2  | 2 | 2 | 1 | 2 | 3 | 1 | 3 | 2 | 60 | 30 | 500 | 275 | 800 | 5000 | 5000 | 45 |
| TM4  | 2 | 2 | 2 | 3 | 1 | 2 | 1 | 3 | 60 | 30 | 550 | 350 | 700 | 7000 | 1000 | 70 |
| TM6  | 2 | 2 | 3 | 1 | 2 | 3 | 2 | 1 | 60 | 30 | 600 | 200 | 750 | 9000 | 3000 | 20 |
| TM18 | 2 | 3 | 1 | 3 | 2 | 3 | 1 | 2 | 60 | 35 | 500 | 350 | 750 | 9000 | 1000 | 45 |
| TM14 | 2 | 3 | 2 | 1 | 3 | 1 | 2 | 3 | 60 | 35 | 550 | 200 | 800 | 5000 | 3000 | 70 |
| TM16 | 2 | 3 | 3 | 2 | 1 | 2 | 3 | 1 | 60 | 35 | 600 | 275 | 700 | 7000 | 5000 | 20 |

FIG. 3 REGIONS OF AN $NH_3/SiH_4$ FLOW RATE RATIO AND A FILM FORMING PRESSURE PERMITTING A FILM THICKNESS RATIO OF HIGH DENSITY REGION TO LOW-DENSITY REGION NOT LESS THAN 85% AND NOT LESS THAN 95%

MANUFACTURING METHOD OF SEMICONDUCTOR INTEGRATED CIRCUIT DEVICE

CROSS-REFERENCE TO RELATED APPLICATION

This application is a continuation of application Ser. No. 09/905,887 filed Jul. 17, 2001. Now U.S. Pat. No. 6,632,750.

BACKGROUND OF THE INVENTION

The present invention relates to a technique for manufacturing a semiconductor integrated circuit, particularly a technique effective when applied to the fabrication of a semiconductor integrated circuit device having a step of depositing a silicon nitride film over a substrate by using thermal CVD (Chemical Vapor Deposition).

In a manufacturing process of a highly miniaturized and highly integrated LSI which has been adopted in recent days, a shallow groove isolation (SGI) is formed in a silicon substrate or a contact hole is formed in self alignment with a gate electrode of MISFET (Metal Insulator Semiconductor Field Effect Transistor) by making use of a difference in an etching rate between a silicon oxide film and a silicon nitride film. A formation process of such a shallow groove isolation (SGI) is described, for example, in Japanese Patent Application Laid-Open No. Hei 11(1999)-16999, while a formation process of such a self align contact (SAC) is described, for example, in Japanese Patent Application Laid-Open No. Hei 11(1999)-17147.

It is the common practice to form a silicon nitride film, which is utilized in the forming step of the above-described shallow groove isolation or self align contact, by thermal CVD using monosilane ($SiH_4$) and ammonia ($NH_3$) as a source gas. As a CVD reactor, employed is a batch-system hot-wall thermal CVD reactor for heat treating a plurality of semiconductor wafers (ex. 100 wafers or so) simultaneously. This hot-wall thermal CVD reactor adopts an indirect heating system of semiconductor wafers (radiation heating of semiconductor wafers by a heater outside a pipe wall) and it has a structure such that the inside wall of a chamber (reaction chamber) and the whole atmosphere in the chamber are heated to a temperature not less than the decomposition temperature of the source gas. In addition, since the source gas must be diffused in a large-volume chamber of this batch-system thermal CVD reactor, this reactor adopts low pressure CVD wherein a film is usually formed under reduced pressure conditions not greater than 0.13 kPa (1 Torr).

The present inventors have investigated on the film forming technique of a silicon nitride film by thermal CVD. The following is the outline of it.

The batch-system hot-wall thermal CVD reactor widely used for the formation of a silicon nitride film is structured to heat the whole atmosphere in the chamber (reaction chamber) so that a reaction product is deposited even on the inside wall of the chamber and becomes a cause for contamination of a wafer. In addition, cumbersome washing must be conducted frequently for removing this deposit from the inside wall of the chamber.

As described above, in the batch-system thermal CVD reactor, film formation is conducted under reduced pressure conditions not greater than 0.13 kPa (1 Torr), which retards a film forming rate. To make up for this retardation, about 100 wafers are treated simultaneously. With a rise in the volume of the chamber accompanied by an increase in the diameter of a wafer, it takes much time to diffuse a source gas uniformly, leading to a deterioration in the through-put of film formation. In a batch-system reactor for simultaneously treating a larger number of wafers, there also occur problems such as difficulty in maintaining a uniform film thickness within the face of the wafer and dislocation of wafer.

Recently, there is a tendency to adopt, as a countermeasure against a reduction in the threshold voltage of the miniaturized MISFET, a so-called dual gate CMOS structure (or also called CMIS (Complementary Metal Insulator Semiconductor)) wherein the gate electrode of an n channel type MISFET is made of n-type polycrystalline silicon and the gate electrode of a p channel type MISFET is made of p-type polycrystalline silicone and both serve as a surface channel type.

In this case, there is a potential danger that by the high temperature heat treatment after formation of a gate electrode, p-type impurity (boron) in the gate electrode made of p-type polycrystalline silicon may be diffused in a semiconductor substrate (well) through a gate oxide film, thereby causing fluctuations in the threshold voltage of MISFET. Deposition of a silicon nitride film after formation of the gate electrode therefore needs precise control of temperature conditions upon film formation. It is however difficult to set temperature conditions precisely in the above-described batch system thermal CVD reactor.

Plasma CVD is known as a method capable of depositing a silicon nitride film at a relatively low temperature without causing fluctuations of the characteristics of MISFET. It however involves drawbacks such as damage of a gate oxide film by plasma and charging up. It is therefore difficult to apply this method to formation of a silicon nitride film for sidewall spacers or silicon nitride film for self align contact.

In a single-wafer thermal CVD reactor which treats wafers one by one in one chamber, on the other hand, the volume of the chamber can be lowered compared with the above-described batch system thermal CVD reactor, which makes it possible to control temperature conditions precisely and improve the uniformity of the film thickness of a large-diameter wafer within its face. In addition, a source gas can be diffused uniformly and promptly even under sub-atmospheric reduced pressure conditions of 1.3 kPa (10 Torr) to 93 kPa (700 Torr), higher than the pressure conditions of the batch-system thermal CVD reactor, which makes it possible to improve a film forming velocity. In addition, by treating wafers one by one, the flow of wafer treatment is not interrupted so that a cycle time of a wafer process can be shortened and work in process can be reduced.

In order to make up for a reduction in the through-put due to treatment of wafers one by one, this single-wafer thermal CVD reactor adopts a cold wall system of heating only the wafer and its vicinity, so that there is not a potential danger of wafers being contaminated with reaction products deposited on the inside wall of the chamber and washing of the inside wall of the chamber is lightened.

Based on these investigation results, the present inventors reach a conclusion that use of a single-wafer cold-wall thermal CVD reactor is effective for the formation of a silicon nitride film required to have highly uniform thickness, for example, a silicon nitride film for side wall spacers or self align contact on a wafer having a diameter as large as about 20 to 30 cm.

The present inventors however found a new problem while investigating the introduction of a single-wafer cold-wall thermal CVD for the manufacturing process of a memory LSI under development.

In general, a memory LSI includes, in one chip, a memory mat and a peripheral circuit. In the memory mat, MISFETs constituting a memory cell are disposed with a markedly high density in order to realize a large-scale memory capacity, while in the peripheral circuit, MISFETs are disposed not so densely. On each of a plurality of chip regions sectioned on a wafer, there appears a region wherein gate electrode patterns are formed with low density (peripheral circuit) and a region with high density (memory mat).

When a silicon nitride film was deposited over such a wafer by thermal CVD, there appeared a phenomenon that in each of the plurality of chip regions, the silicon nitride film over the memory mat is thinner by about 30% than that over the peripheral circuit. This is presumed to occur because the effective surface area per wafer unit area is larger in the high-density region of gate electrodes (memory mat) than in the low-density region (peripheral circuit), which causes, in the former region, a relative shortage in the feed amount of a source gas and in turn, decreases a film deposition amount.

When such a problem (uneven film thickness) occurs, upon formation of side wall spacers on the side walls of the gate electrode of a memory mat or on the side walls of a peripheral circuit or formation of a contact hole in self alignment with the gate electrode or shallow groove isolation by dry etching of a silicon nitride film, complete etching of the thick silicon nitride film deposited over the peripheral circuit removes not only a thin silicon nitride film deposited over the memory mat but also the surface of the underlying film (gate oxide film or substrate), resulting in deterioration in the characteristics of MISFETs constituting a memory cell.

It is generally considered that the film forming mechanism of a silicon nitride film by thermal CVD using monosilane ($SiH_4$) and ammonia ($NH_3$) as a source gas owes to endothermic reaction by which silicon nitride ($Si_3N_4$) is formed as a result of thermal decomposition of monosilane ($SiH_4$) and ammonia ($NH_3$) as shown in the following equation (1):

$$3SiH_4 + 4NH_3 \rightarrow Si_3N_4 + 12H_2 \qquad (1)$$

In this reaction, the formation rate of silicon nitride is determined by the feed amount of monosilane ($SiH_4$).

When a silicon nitride film is deposited over a wafer having both a high pattern density region and a low pattern density region, a difference in the thickness of the silicon nitride film between the memory mat and peripheral circuit can be reduced by increasing a flow rate ratio ($SiH_4/NH_3$) of monosilane to ammonia, thereby supplying a sufficient amount of monosilane to the memory mat having a larger effective surface area.

Upon deposition of a silicon nitride film over a wafer by using a single-wafer cold-wall thermal CVD reactor, the present inventors increased a flow rate ratio of monosilane based on the above-described presumption. Contrary to their expectation, a difference in film thickness between the memory mat and peripheral circuit was not decreased. The present inventors therefore searched for its cause and drew a conclusion as described below.

When a hot-wall batch-system CVD reactor which heats the whole atmosphere in the chamber, a source gas introduced into the chamber is heated to a temperature not less than the decomposition point of monosilane and ammonia before it reaches the surface of the wafer. A thermally decomposed gas is therefore fed to the surface of the wafer. In a single-wafer cold-wall thermal CVD reactor which heats only a stage (susceptor) to have a wafer mounted thereon, on the other hand, the temperature of only the wafer and its vicinity becomes high so that monosilane and ammonia in the source gas are thermally decomposed not rightly after they are introduced into the chamber but after they reach the vicinity of the surface of the wafer. The decomposition rate of ammonia having a decomposition temperature higher by about 250° C. than monosilane becomes relatively slow compared with monosilane, resulting in shortage in the amount of nitrogen atoms supplied to the surface of the wafer. In this case, even by an increase in the feed amount of monosilane, film formation rate of a silicon nitride film over a memory mat cannot be improved.

The present inventors thus revealed that it is impossible to apply, to film formation of a silicon nitride film by using a single-wafer cold-wall thermal CVD reactor, a forming mechanism of the silicon nitride film that when a conventional hot-wall batch-system CVD reactor is used, an uneven film appears because a film formation rate is determined depending on the feed amount of monosilane ($SiH_4$).

SUMMARY OF THE INVENTION

An object of the present invention is to provide a technique capable of reducing, upon deposition of a silicon nitride film by thermal CVD over a semiconductor wafer having a low pattern density region and a high pattern density region, a difference in the thickness of the silicon nitride film between the low pattern density region and high pattern density region.

The above-described object, the other objects and novel features of the present invention will be apparent from the description herein and accompanying drawings.

Of the inventions disclosed in this application, typical ones will next be summarized.

In one aspect of the present invention, there is thus provided a manufacturing method of a semiconductor integrated circuit device which comprises (a) depositing a first silicon nitride film over the main surface of a semiconductor substrate by thermal CVD using a first source gas containing a silane-based gas and an ammonia gas; (b) forming, over the main surface of the semiconductor substrate, a plurality of first patterns having a low pattern density region and a high pattern density region; and (c) depositing a second silicon nitride film over the main surface of the semiconductor substrate, which has a plurality of first patterns formed thereover, by thermal CVD using a second source gas containing a silane-based gas and an ammonia gas; wherein the first source gas and second source gas are different from each other in a flow rate ratio of said silane-based gas to said ammonia gas.

In another aspect of the present invention, there is also provided a manufacturing method of a semiconductor integrated circuit device, which comprises (a) depositing a first silicon nitride film over the main surface of a semiconductor wafer by thermal CVD using a first source gas containing a silane-based gas and an ammonia gas; (b) forming, over the main surface of the semiconductor wafer, a plurality of first patterns having a low pattern density region and a high pattern density region; and (c) depositing a second silicon nitride film over the main surface of the semiconductor substrate, which has a plurality of first patterns formed thereover, by thermal CVD using a second source gas containing a silane-based gas and an ammonia gas; wherein the second source gas is larger than the first source gas in a flow rate ratio of the ammonia gas to the silane-based gas.

In a further aspect of the present invention, there is also provided a manufacturing method of a semiconductor integrated circuit device, which comprises (a) depositing a first silicon nitride film over the main surface of a semiconductor wafer by thermal CVD using a first source gas containing a silane-based gas and an ammonia gas; (b) forming, over the main surface of the semiconductor wafer, a plurality of gate electrodes having a low pattern density region and a high pattern density region; (c) depositing a second silicon nitride film over the main surface of the semiconductor wafer, which has said plurality of gate electrodes formed thereof, by thermal CVD using a second source gas containing a silane-based gas and an ammonia gas; and (d) forming side wall spacers made of the second silicon nitride film on side walls of each of the plurality of gate electrodes by anisotropic etching of the second silicon nitride film; wherein the second source gas is larger than the first source gas in a flow rate ratio of the ammonia gas to the silane gas.

It should be noted that in the present application, the term "semiconductor integrated circuit device" means not only that formed over a single crystal silicon substrate but also that formed on another substrate such as SOI (Silicon On Insulator) substrate or a substrate for fabricating TFT (Thin Film Transistor) liquid crystals unless otherwise specifically indicated. The term "wafer" as used herein means a single silicon substrate (usually, an almost disk shape), SOI substrate, glass substrate and the other insulating, semi-insulating or semiconductor substrate, and composite thereof, each used for the fabrication of a semiconductor integrated circuit device.

The term "chip" or "chip region" means a unit of an integrated circuit region as illustrated in FIG. 1 corresponding to a portion of a wafer sectioned after all the steps are completed.

The term "sub-atmospheric reduced pressure region" usually means a pressure range of 1.3 kPa to 93 kPa. The term "sub-atmospheric pressurized region" means, in this application, a pressure range of 106 kPa to 133 kPa and a region including this region and an atmospheric pressure region is called "sub-atmospheric pressure region".

A single-wafer cold-wall thermal CVD reactor is usually a CVD reactor which is a cold wall type heat treating furnace permitting heating (resistance heating, high frequency induction heating or lamp heating) of a wafer to a temperature higher than the peripheral wall of the reactor and film formation wafer by wafer without directly heating using, for example, plasma.

A gas atmosphere may contain, in addition to a reactant gas, carrier gas and dilution gas, an additive gas. When a reference is made to a gas composition, the gas composition is permitted to contain another component unless otherwise specifically indicated.

In the below-described embodiments, reference is made to the number (including the number, numerical value, quantity and range) of elements. The number of the elements is however not limited to a specific one and elements may be used in the number less or greater than the specific number unless otherwise particularly indicated or apparently limited to a specific number in principle. Furthermore in the below-described embodiments, it is obvious that constituting elements (including elemental steps or the like) are not always indispensable unless otherwise particularly specified or unless otherwise presumed to be apparently indispensable in principle.

Similarly, when reference is made to the shape, positional relationship or the like of constituting elements, those substantially close or similar to their shapes or the like are included unless otherwise specifically indicated or presumed to be apparently different in principle. This also applies to the above-described numerical value and range.

DETAILED DESCRIPTION OF THE DRAWINGS

FIG. 13 shows various parameters upon deposition of a silicon nitride film and a change in the difference in thickness of the silicon nitride film according to each of the parameters.

DETAILED DESCRIPTION OF THE PREFERRED EMBODIMENTS

Figure 1:
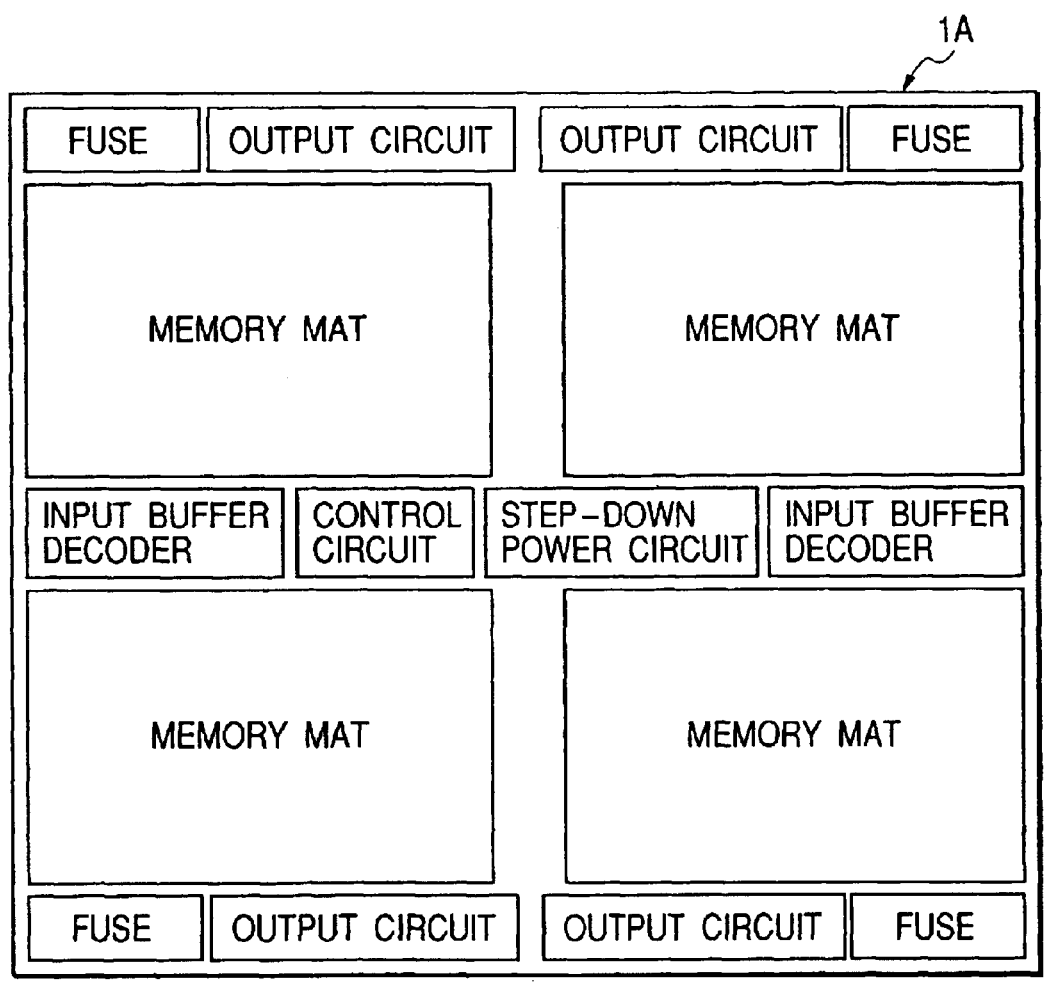
FIG. 1 is a block diagram of a semiconductor chip having SRAM formed thereon according to one embodiment of the present invention.

Embodiments of the present invention will hereinafter be described more specifically based on accompanying drawings. Incidentally, in all the drawings for illustrating embodiments, elements having like function will be identified by like reference numerals and overlapping descriptions will be omitted.

Embodiment 1

FIG. 1 is a block diagram of Silicon chip 1A having SRAM (Static Random Access Memory) of this embodiment formed thereon. Silicon chip 1A having SRAM formed thereon is, for example, integrated in a portable electronic equipment and it has, on the main surface thereof, a memory portion sectioned into a plurality of memory mats and a peripheral circuit having an input/output circuit (input buffer decoder, output circuit), control circuit and reference voltage generating circuit (step-down power circuit).

Figure 2:
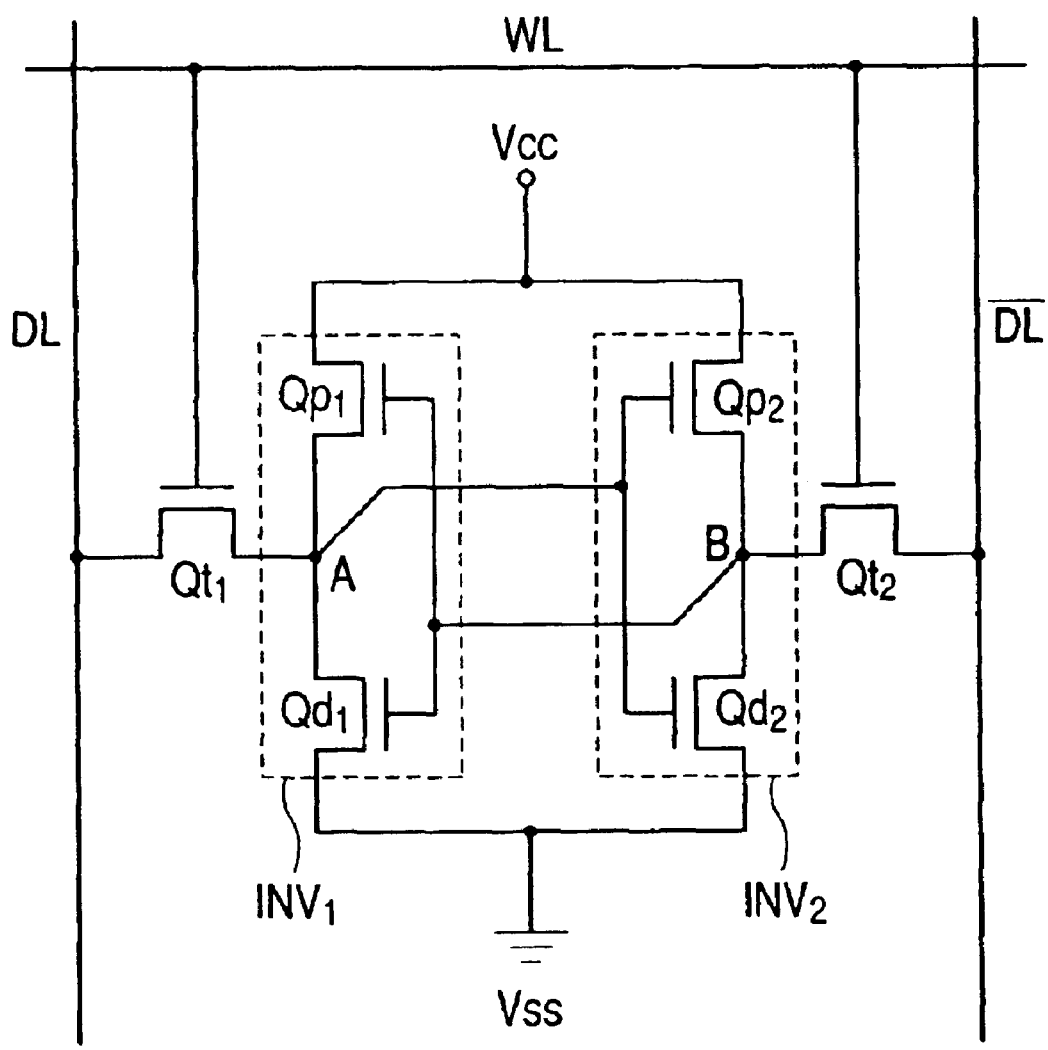
FIG. 2 is an equivalent circuit diagram of a memory cell of SRAM according to the one embodiment of the present invention.

FIG. 2 is an equivalent circuit diagram of a memory cell formed in the memory portion. The memory cell of SRAM has a pair of driver MISFETs ($Qd_1,Qd_2$), a pair of load MISFETs ($Qp_1,Qp_2$) and a pair of transfer MISFETs ($Qt_1, Qt_2$) which are disposed at the intersection of a pair of complementary data lines ($DL,/DL$) and a word line WL. The driver MISFETs ($Qd_1,Qd_2$) and transfer MISFETs ($Qt_1, Qt_2$) are each formed of an n-channel type MISFET, while the load MISFETs ($Qp_1,Qp_2$) are each formed of a p-channel type MISFET. In short, the memory cell is formed of a complete CMOS type for which 4 n-channel type MISFETs and 2-channel type MISFETS are used. Compared with a negative resistance type memory cell for which 4 n-channel type MISFETs and two high-resistance load elements are used, the complete CMOS type memory cell features low consumption power owing to a small amount of leak current upon stand-by.

Among the above-described 6 MISFETs constituting the memory cell, the driver MISFET $Qd_1$ and load MISFET $Qp_1$ constitute a first inverter ($INV_1$), while the driver MISFET $Qd_2$ and load MISFET $Qp_2$ constitute a second inverter ($INV_2$) A pair of these CMOS inverters ($INV_1,INV_2$) are cross-connected in the memory cell and constitute a flip-flop circuit as an information storage portion for storing one bit of data.

One of the input-output terminals of this flip-flop circuit is connected to one of the source and drain of the transfer MISFET $Qt_1$, while the other input-output terminal is connected to one of the source and drain of the transfer MISFET $Qt_2$. The other one of the source and drain region of the transfer MISFET $Qt_1$ is connected to the data line DL, while the other one of the source and drain of the transfer MISFET $Qt_2$ is connected to the data line/DL. One end (one of the source and drain of each of two load MISFETs $Qp_1,Qp_2$) of the flip-flop circuit is connected to a power voltage (Vcc) of 3.3V, while the other end (one of the source and drain of each of the driver MISFETs $Qd_1,Qd_2$) is connected, for example, to a GND voltage of 0V (Vss).

Figure 3:
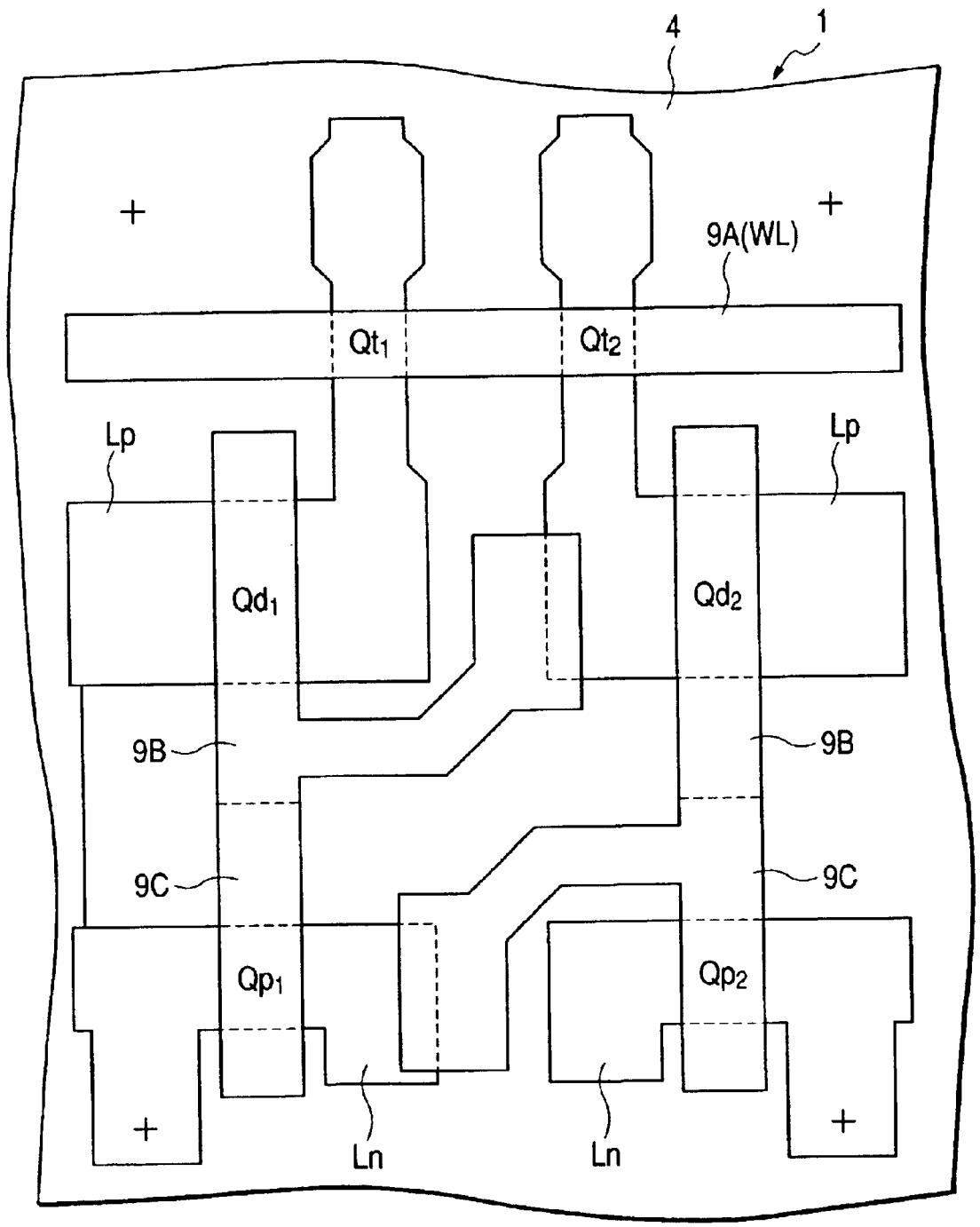
FIG. 3 is a plan view illustrating gate electrode patterns of MISFETs constituting the memory cell of SRAM according to the one embodiment of the present invention.

FIG. 3 is a plain view illustrating a pattern of a gate electrode of each of the above-described six MISFETs constituting the memory cell. A rectangular region defined by connecting four marks of+by a straight line corresponds to one memory cell.

The six MISFETs (driver MISFET $Qd_1,Qd_2$, load MISFET $Qp_1,Qp_2$ and transfer MISFET $Qt_1,Qt_2$) constituting a memory cell are formed in active regions (Ln,Lp) surrounded by a shallow groove isolation 4 on the main surface of a substrate 1. The driver MISFETs $Qd_1,Qd_2$ and transfer MISFETs $Qt_1,Qt_2$ each constituted of an n-channel type MISFET are formed in an active region Lp wherein a p-type well has been formed, while the load MISFETs $Qp_1,Qp_2$ each constituted of a p-channel type MISFET are formed in an active region Ln wherein an n-type well has been formed.

The transfer MISFETs $Qt_1,Qt_2$ have a gate electrode 9A integrally formed with the word line WL. This gate electrode 9A is formed of an n-type polycrystalline silicon film having phosphorus (P) doped therein and a Co (cobalt) silicide layer formed over the polycrystalline silicon film.

The driver MISFET $Qd_1$ and load MISFET $Qp_1$ constituting the first inverter ($INV_1$) of the flip-flop circuit has gate electrodes integrally formed therewith. Of these gate electrodes, a portion (gate electrode 9B) to be used as a gate electrode of the driver MISFET $Qd_1$ is formed of an n-type polycrystalline silicon film having phosphorus doped therein and a Co silicide layer formed thereover, while a portion (gate electrode 9C) to be used as a gate electrode of the load MISFET $Qp_1$ is formed of a p-type polycrystalline silicon film having boron (B) doped therein and a Co silicide layer formed thereover.

Similarly, the driver MISFET $Qd_2$ and load MISFET $Qp_2$ constituting the second inverter ($INV_2$) of the flip-flop circuit has gate electrodes integrally formed therewith. Of these gate electrodes, a portion (gate electrode 9B) to be used as a gate electrode of the driver MISFET $Qd_2$ is formed of an n-type polycrystalline silicon film having phosphorus doped therein and a Co silicide layer formed thereover, while a portion (gate electrode 9C) to be used as a gate electrode of the load MISFET $Qp_2$ is formed of a p-type polycrystalline silicon film having boron (B) doped therein and a Co silicide layer formed thereover.

Peripheral circuits such as input/output circuit (input buffer decoder, output circuit), control circuit and reference voltage generating circuit (step-down power circuit) is formed of a complementary MISFET having an n channel type MISFET and a p channel type MISFET used in combination. The gate electrode of the n channel type MISFET is made of a phosphorus-doped n-type polycrystalline silicon film and a Co silicide layer formed thereover, while the gate electrode of the p channel type MISFET is made of a boron-doped p-type polycrystalline silicon film and a Co silicide layer formed thereover.

A manufacturing method of MISFETs constituting each of the memory cell and peripheral circuit of the above-described SRAM will hereinafter be described with reference to FIGS. 4 to 19.

Figure 4:
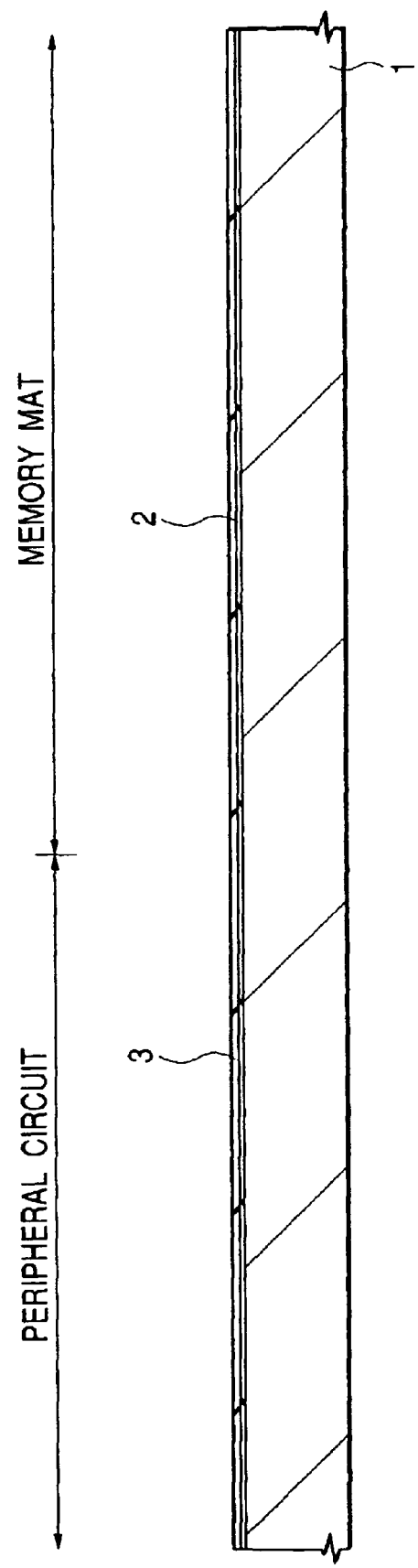
FIG. 4 is a fragmentary cross-sectional view of a semiconductor substrate illustrating a manufacturing method of SRAM according to the one embodiment of the present invention.

As illustrated in FIG. 4, a substrate (silicon wafer) 1 having a specific resistance of about 1 to 10 Ωm and made of p-type single crystal silicon is thermally oxidized at about 850° C. to form, over the surface of the substrate, a thin silicon oxide film 2 of about 10 nm thick. A silicon nitride film 3 of about 120 nm thick is then deposited over the silicon oxide film 2 by CVD. This silicon nitride film 3 serves as a mask upon etching of the substrate 1 in an element isolating region to form a groove. The silicon nitride film 3 also serves as a protective mask against oxidation of the surface of the underlying substrate 1 because of its oxidation resistant properties. The silicon oxide film 2 lying below the silicon nitride film 3 relaxes a stress on the interface between the substrate 1 and silicon nitride film 3, thereby preventing defects such as dislocation from appearing on the surface of the substrate 1 owing to this stress.

Figure 5:
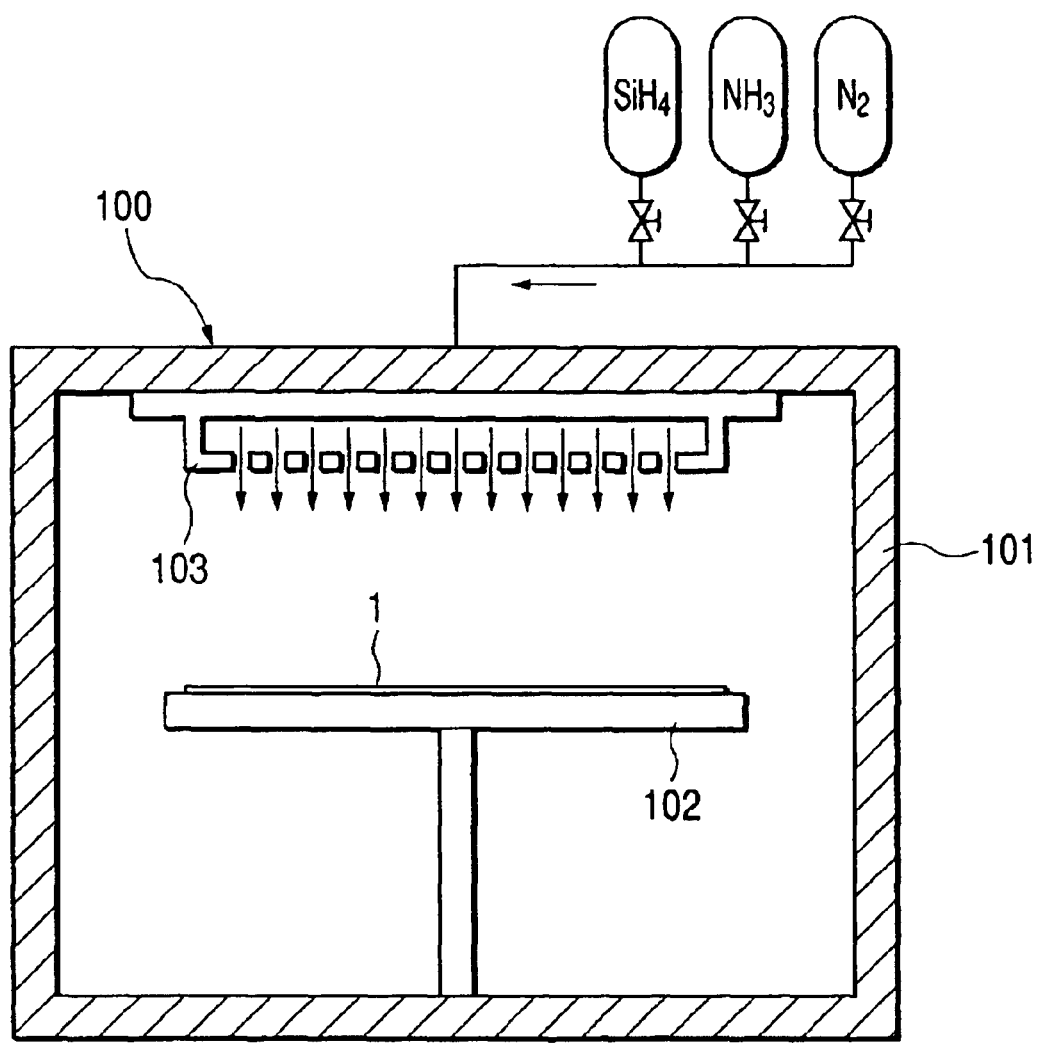
FIG. 5 is a schematic view of a single-wafer cold-wall thermal CVD reactor used for the fabrication of SRAM according to the one embodiment of the present invention.

FIG. 5 is a schematic view of a single-wafer cold-wall thermal CVD reactor 100 to be used for deposition of the silicon nitride film 3.

At the center of the chamber 101 of the single-wafer thermal CVD reactor 100, a stage 102 is disposed to have a silicon wafer (substrate) 1 mounted thereon. Inside of the stage 102, a heater (not illustrated) for heating the silicon wafer 1 is disposed. Above the stage 102, disposed is a shower head for feeding the surface of the silicon wafer 1 with a source gas made of monosilane ($SiH_4$) and ammonia ($NH_3$) with a carrier gas such as nitrogen ($N_2$). Outside the chamber 101, disposed is a temperature regulating mechanism (not illustrated) for setting the temperature of the inside wall of the chamber 101 lower than the temperature of the stage 102 or silicon wafer 1.

In the single-wafer thermal CVD reactor 100 which treats silicon wafers one by one in one chamber 101, accurate temperature conditions can be maintained easily and film thickness on a wafer face can be made uniform compared with a batch system thermal CVD reactor. Particularly, in this cold-wall CVD reactor for forming a film while setting the inside wall temperature of the chamber 101 lower than that of the stage 102 or silicon wafer 1, a large portion of the source gas reacts on the surface of the silicon wafer 1 and forms a film and almost no film is deposited on the inside wall of the chamber 101 which has a lower temperature. In this manner, film formation can be carried out with high through-put.

In a hot-wall CVD reactor which carries out film formation while heating the inside of the chamber wholly and uniformly, on the other hand, a film is inevitably deposited not only the surface of the wafer but also the surface of the inside wall of the chamber 101. It therefore takes time to deposit a film of a desired thickness over the surface of the wafer and moreover, a film deposited on the surface of the inside wall of the chamber 101 must be removed periodically.

In this Embodiment, the silicon nitride film 3 is deposited under the conditions of a monosilane flow rate of 20 sccm, ammonia flow rate of 1400 sccm, nitrogen flow rate of 3600 sccm and gas pressure of 36 kPa (275 Torr) while setting the temperature of the silicon wafer 1 at 750° C. and inside wall temperature of the chamber 101 at 30° C. The silicon nitride film 3 has a substantially uniform thickness all over the surface of the substrate (silicon wafer) 1, because the underlying silicon oxide film 2 has a flat surface.

Figure 6:
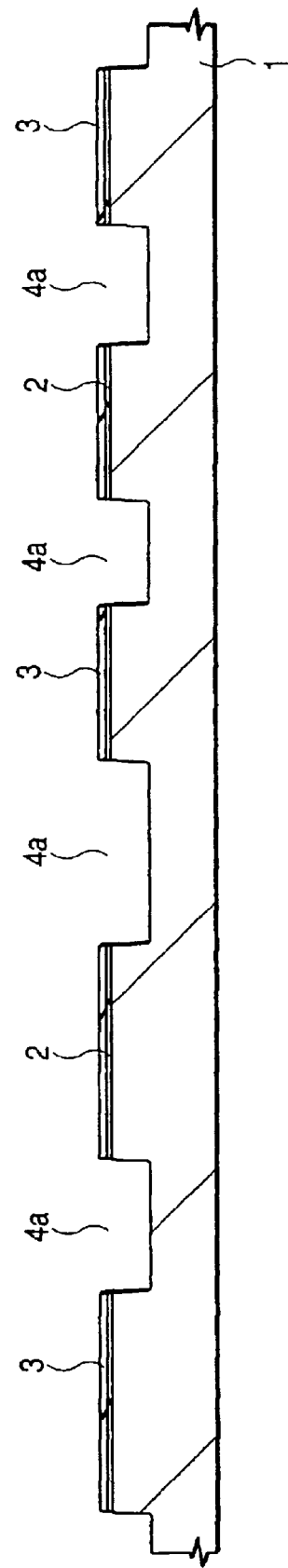
FIG. 6 is a fragmentary cross-sectional view of a semiconductor substrate illustrating the manufacturing method of SRAM according to the one embodiment of the present invention.

As illustrated in FIG. 6, by dry etching with a photoresist film (not illustrated) as a mask, the silicon nitride film 3 and underlying silicon oxide film 2 are selectively removed from the element isolation region, followed by formation of a groove 4a of about 350 to 400 nm deep in the substrate 1 of the element isolating region by dry etching with the silicon nitride film 3 as a mask.

Figure 7:
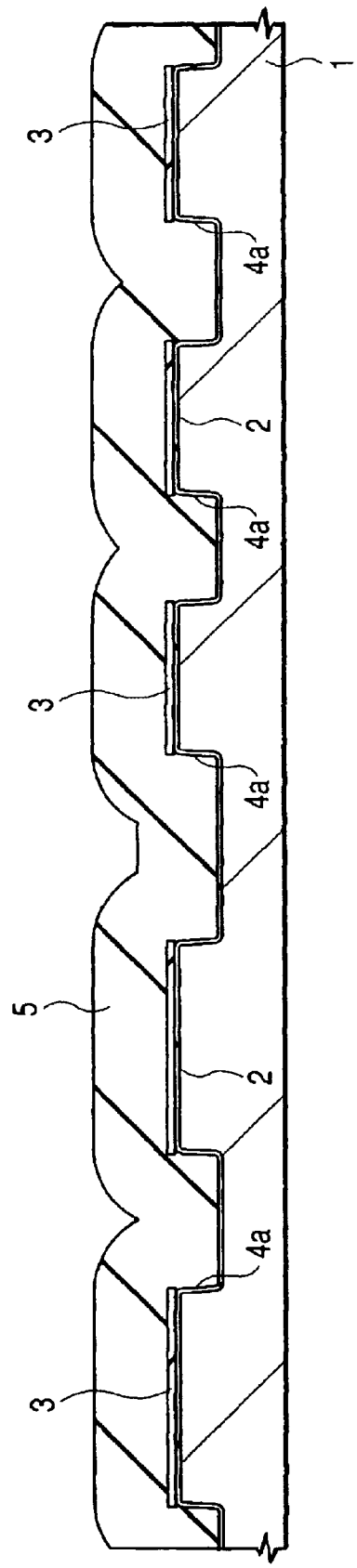
FIG. 7 is a fragmentary cross-sectional view of a semiconductor substrate illustrating the manufacturing method of SRAM according to the one embodiment of the present invention.

As illustrated in FIG. 7, a silicon oxide film 5 is deposited over the substrate 1 including the inside of the groove 4a. This silicon oxide film 5 is deposited to give a film thickness (ex. about 450 to 500 nm) greater than the depth of the groove 4a so as to completely embed the inside of the groove 4a with the silicon oxide film 5. The silicon oxide film 5 is deposited by plasma CVD using, for example, oxygen and tetraethoxysilane (($C_2H_5)_4Si$) as a source gas.

Figure 8:
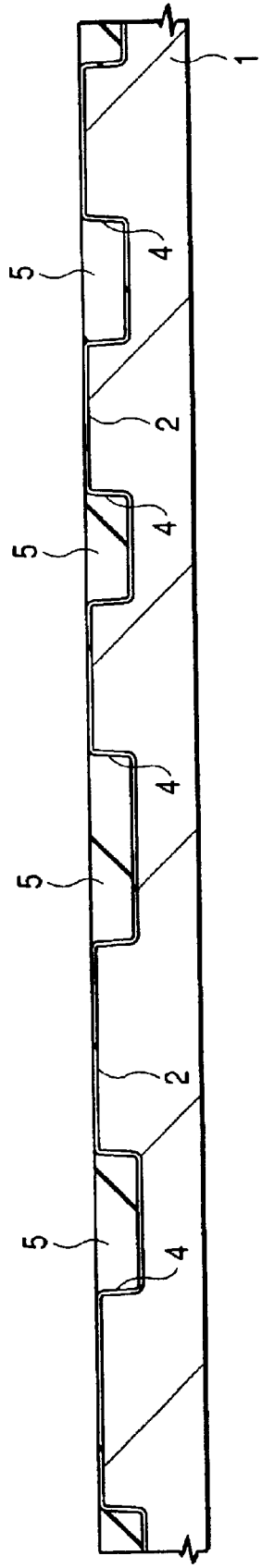
FIG. 8 is a fragmentary cross-sectional view of a semiconductor substrate illustrating the manufacturing method of SRAM according to the one embodiment of the present invention.

The substrate 1 is then thermally oxidized at about 1000° C. to densify it in order to improve the quality of the silicon oxide film 5 embedded in the groove 4a. As illustrated in FIG. 8, the silicon oxide film 5 over the groove 4a is polished by chemical mechanical polishing (CMP) to planarize its surface, whereby a shallow groove isolation 4 is formed. With the silicon nitride film 3 covering the surface of the substrate 1 in the active region as a stopper, polishing is conducted. When the surface height of the silicon oxide film 5 becomes equal to that of the silicon nitride film 3, polishing is stopped. The silicon nitride film 3 covering the surface of the substrate 1 in the active region is then removed by hot phosphoric acid.

Figure 9:
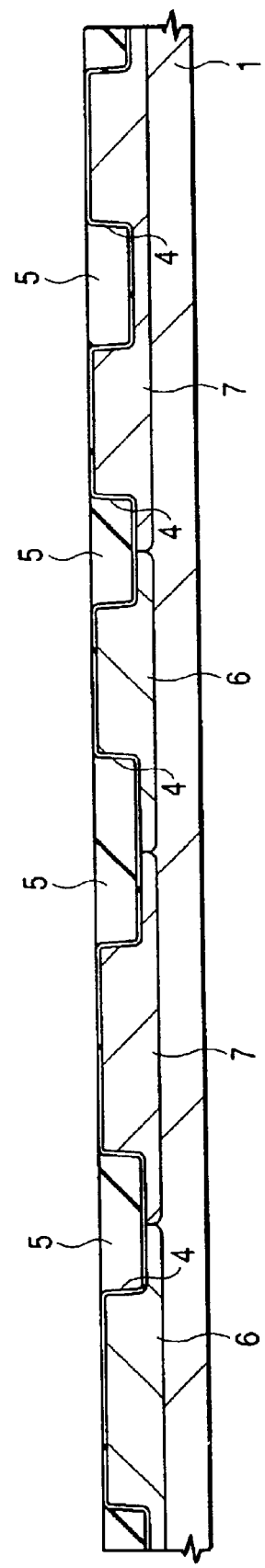
FIG. 9 is a fragmentary cross-sectional view of a semiconductor substrate illustrating the manufacturing method of SRAM according to the one embodiment of the present invention.

As illustrated in FIG. 9, after ion-implantation of an n-type impurity (ex. phosphorus) in one portion of the substrate 1 and a p-type impurity (ex. boron) in the other portion, the substrate 1 is heat treated at about 950° C. to diffuse the above-described impurities, whereby an n-type well 6 is formed in the one portion of the substrate 1 and a p-type well 7 is formed in the other portion.

Figure 10:
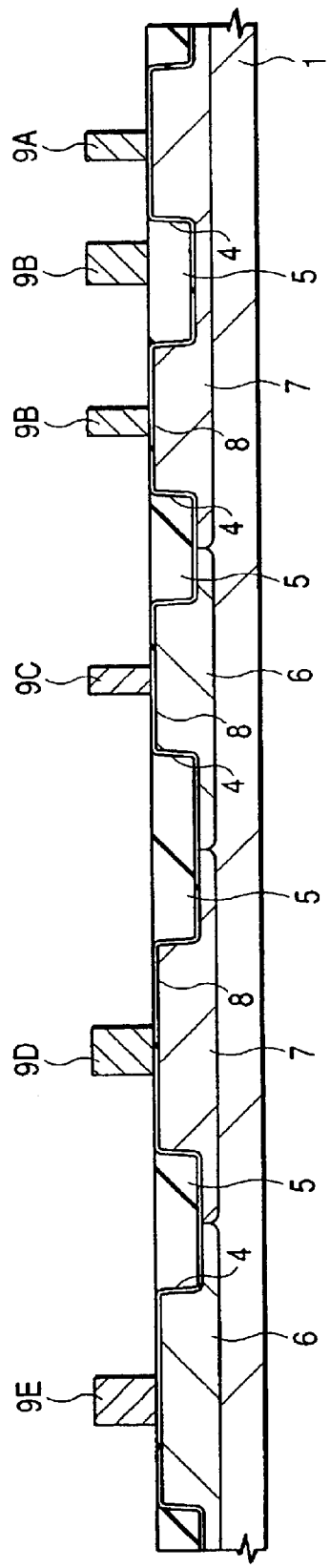
FIG. 10 is a fragmentary cross-sectional view of a semiconductor substrate illustrating the manufacturing method of SRAM according to the one embodiment of the present invention.

As illustrated in FIG. 10, after washing of the surface of the substrate 1 by wet etching with hydrofluoric acid, the substrate 1 is thermally oxidized at about 800 to 850° C., whereby a clean gate oxide film 8 is formed on the surface of each of the n-type well 6 and p-type well 7. Gate electrodes 9A to 9E are then formed over the gate oxide film 8. These gate electrodes 9A to 9E are formed by depositing a polycrystalline silicon film of about 200 to 250 nm thick over the gate oxide film 8 by CVD, implanting ions of an n-type impurity (phosphorus) into a portion of the polycrystalline silicon film and ions of a p-type impurity (boron) into the other portion, and then dry etching the polycrystalline silicon film with a photoresist film as a mask.

The gate electrode 9A is made of a phosphorus-doped n-type polycrystalline film and it is used as a gate electrode or word line WL of the transfer MISFET $Qt_1,Qt_2$ constituting the memory cell partially. The gate electrode 9B is also made of an n-type polycrystalline silicon film and it is used as gate electrode of the driver MISFET $Qd_1,Qd_2$ constituting the memory cell partially. The gate electrode 9C is made of a boron-doped p-type polycrystalline silicon film and is used as gate electrode of the load MISFET $Qp_1,Qp_2$ constituting the memory cell partially.

The gate electrode 9D is made of a phosphorus-doped n-type polycrystalline silicon film and is used as the gate electrode of an n channel type MISFET (Qa) constituting the peripheral circuit partially. The gate electrode 9E is made of a boron-doped p-type polycrystalline silicon film and is used as a gate electrode of a p channel type MISFET (Qb) constituting the peripheral circuit partially.

The six MISFETs (driver MISFETs $Qd_1,Qd_2$, load MISFETs $Qp_1,Qp_2$ and transfer MISFETs $Qt_1,Qt_2$) constituting the memory cell are disposed so closely that the gate electrodes 9A to 9C are disposed close to each other. The MISFETs constituting the peripheral circuit are, on the other hand, disposed not so closely that the gate electrodes 9D,9E are disposed apart. When the gate electrodes 9A to 9E are formed over the main surface of the silicon wafer (substrate) 1, there appears a region wherein gate electrode patterns have been formed with high density (memory mat) and a region wherein gate electrode patterns have been formed with low density (peripheral circuit) in each of the plurality of chip regions sectioned on the main surface of the wafer.

Figure 11:
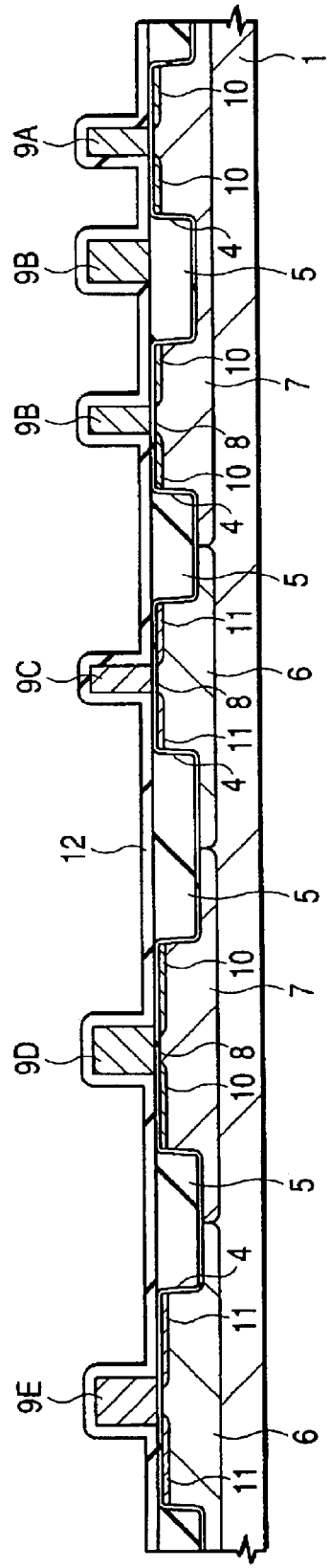
FIG. 11 is a fragmentary cross-sectional view of a semiconductor substrate illustrating the manufacturing method of SRAM according to the one embodiment of the present invention.

As illustrated in FIG. 11, after formation of an $n^-$ type semiconductor region 10 of a low impurity concentration by ion implantation of phosphorus or arsenic (As) into the p-type well 7 and a $p^-$ type semiconductor region 11 of a low impurity concentration by ion implantation of boron into the n-type well 6, a silicon nitride film 12 of about 50 nm thick is deposited by CVD over the main surface of the substrate 1.

For deposition of the above-described silicon nitride film 12, a single-wafer cold-wall thermal CVD reactor 100 as illustrated in FIG. 5 is employed.

Figure 12:
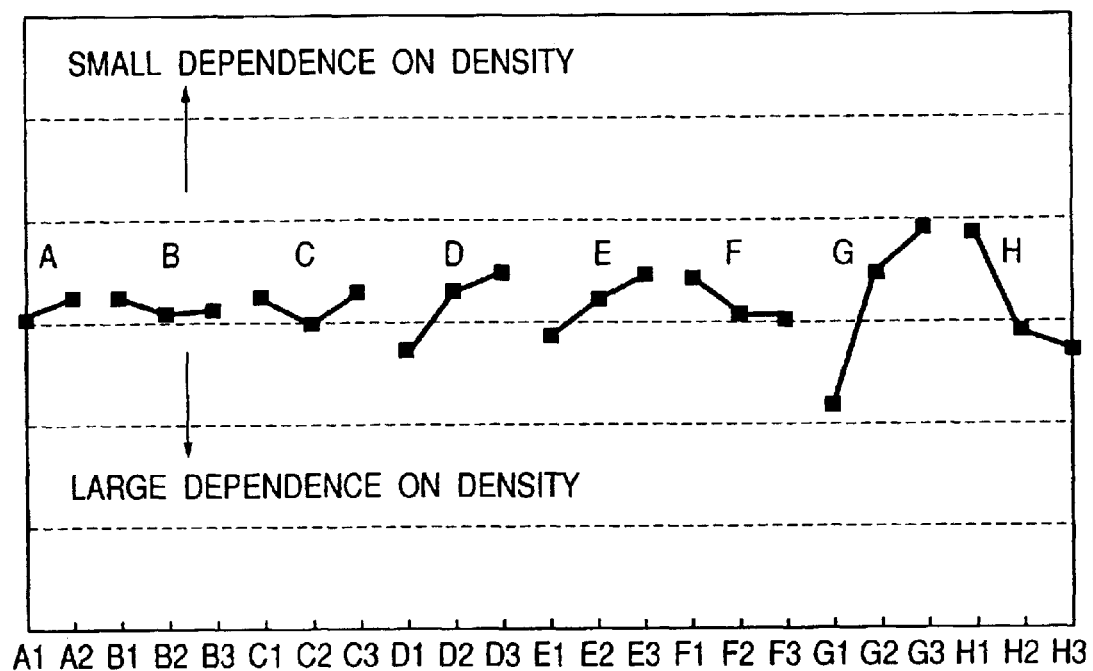
FIG. 12 is a graph showing the relationship between various parameters upon deposition of a silicon nitride film and a difference in thickness of the silicon nitride film between a high pattern density region and a low pattern density region.

In FIG. 12, shown are measurement results of variations in the difference in thickness between the silicon nitride film 12 deposited in the region (memory mat) wherein gate electrode patterns have been formed with high density and the silicon nitride film 12 deposited in the region (peripheral circuit) wherein gate electrode patterns have been formed with low density, as a function of various parameters upon deposition of the silicon nitride film 12. On eight line graphs in this diagram, plotted are, left to right, A: annealing time of ammonia, B: temperature of the inside wall of the chamber 101, C: distance from the stage 102 to the shower head 103, D: gas pressure in the chamber 101, E: temperature of the wafer, F: flow rate of nitrogen, G: flow rate of ammonia and H: flow rate of monosilane. These graphs show variations in a difference in the thickness of the silicon nitride film 12 when eight parameters are each set at three values (only two values for the annealing time of ammonia) as shown in FIG. 13. They indicate that the greater the value, the smaller the film thickness difference.

From these graphs, it has been found that the gas pressure (D) in the chamber 101, ammonia flow rate (G) and monosilane flow rate (H) largely contribute to variations in the film thickness difference. It has also been found that with an increase in the gas pressure (D) in the chamber 101 or the ammonia gas flow rate (G), a difference in the thickness of the silicon nitride film 12 becomes smaller, and with an increase in the monosilane flow rate (H), a difference in the thickness of the silicon nitride film 12 becomes greater.

Figure 14:
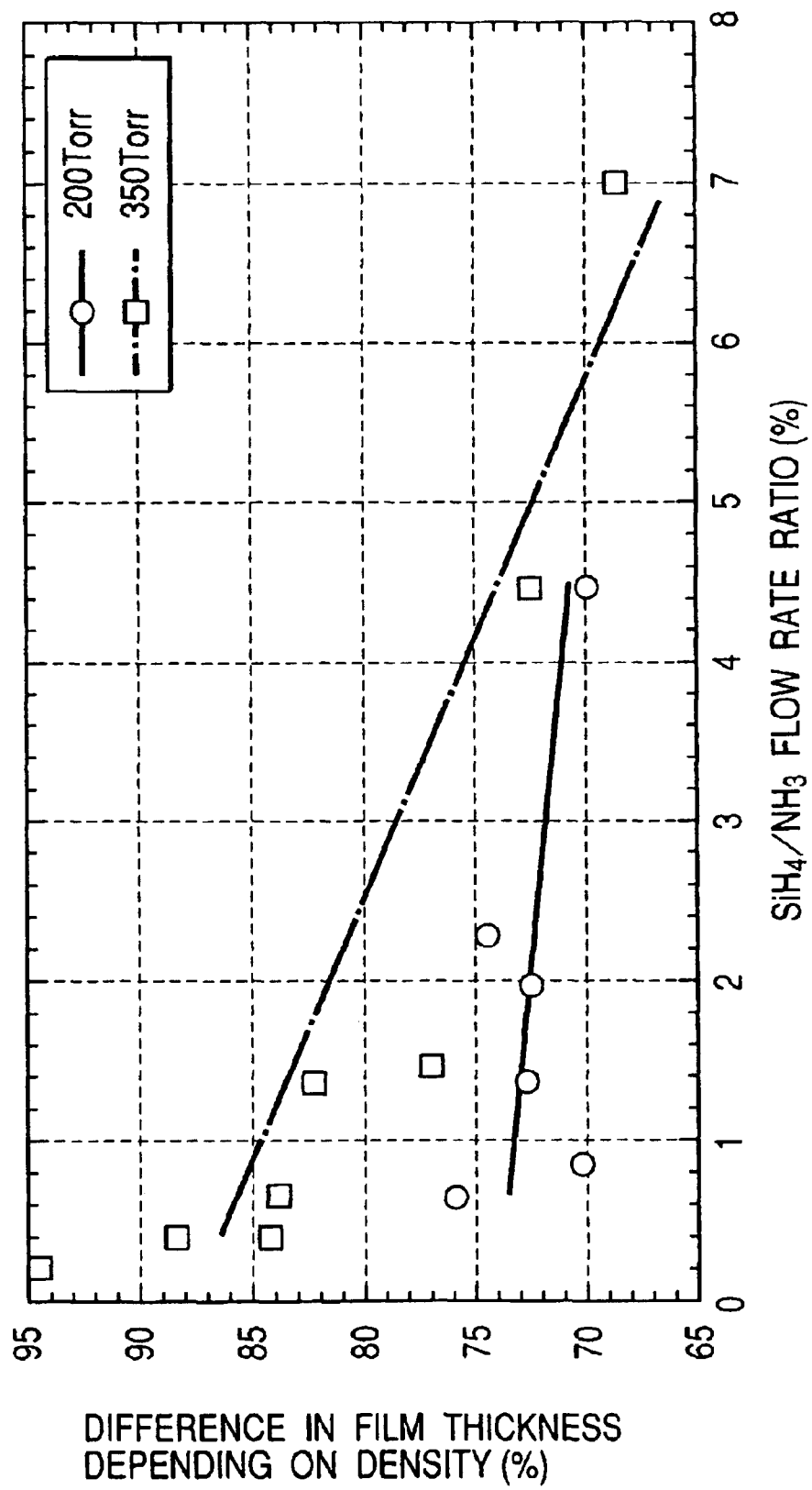
FIG. 14 is a graph showing the relationship between a monosilane/ammonia flow rate ratio and a difference in thickness of a silicon nitride film between high pattern density region and low pattern density region.

FIG. 14 shows the measurement results of a change in a difference in the thickness of the silicon nitride film 12 at varied flow rate ratios (%) of ammonia to monosilane when the gas pressure inside of the chamber 101 is set at 26 kPa (200 Torr) and 46 kPa (350 Torr), respectively. From this graph, it has been found that the greater the flow rate ratio of ammonia, the smaller a difference in the thickness of the silicon nitride film 12.

The above-described measurement results suggest that for decreasing a difference in the thickness between the silicon nitride film 12 deposited in a high gate-electrode-pattern density region (memory mat) and the silicon nitride film 12 deposited in a low gate-electrode-pattern density region (peripheral circuit), an increase in the flow rate ratio of ammonia to monosilane and an increase in the gas pressure in the chamber 101 are effective.

Described specifically, it is desired to set a flow rate ratio of ammonia to monosilane at 40 or greater under the gas pressure of 46 kPa (350 Torr) in order to adjust a ratio of the thickness of the silicon nitride film 12 deposited in a high gate-electrode-pattern density region (memory mat) to the thickness of the silicon nitride film 12 deposited in a low density region (peripheral circuit) at 80% or greater (to decrease a film thickness difference to 20% or less). In order to adjust the above-described ratio at 85% or greater (to decrease a film thickness difference to 15% or less), it is desired to set a flow rate ratio of ammonia to monosilane at 100 or greater, while in order to adjust the above-described ratio at 90% or greater (to decrease a film thickness difference to 10% or less), it is desired to set the above-described flow rate ratio at 250 or greater.

In this Embodiment, the silicon nitride film 12 is deposited under the conditions of a monosilane flow rate of 10 sccm, ammonia flow rate of 5000 sccm, nitrogen flow rate of 5000 sccm and gas pressure of 46 kPa (350 Torr) while setting the temperature of the silicon wafer 1 at 750° C. (the temperature of the heater is set at 800° C., because the upper surface temperature of a wafer is lower by about 50° C. than the set temperature of the heater) and inside wall temperature of the chamber 101 at 25° C. The silicon nitride film 3 thus deposited has a substantially uniform thickness in a high gate-electrode-pattern density region (memory mat) and a low density region (peripheral circuit).

Figure 15:
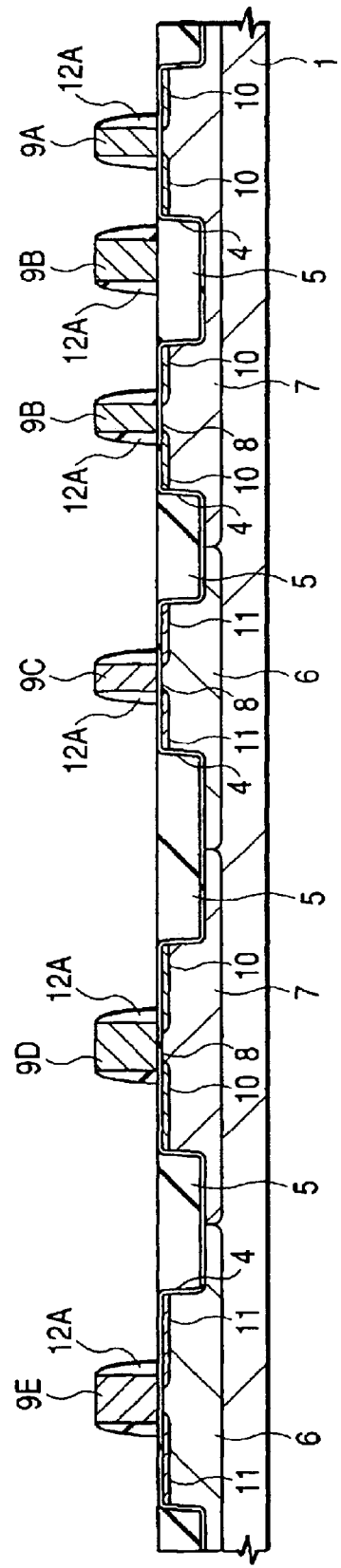
FIG. 15 is a fragmentary cross-sectional view of a semiconductor substrate illustrating the manufacturing method of SRAM according to the one embodiment of the present invention.

As illustrated in FIG. 15, by anisotropic etching of the silicon nitride film 12, side wall spacers 12A are formed on the side walls of each of the gate electrodes 9A to 9E. In this Embodiment, since the silicon nitride film 12 has a substantially uniform thickness in the memory mat and peripheral circuit, the side wall spacers 12a can be formed without causing inevitable etching of the gate oxide film 9 or substrate 1 in the memory mat.

Figure 16:
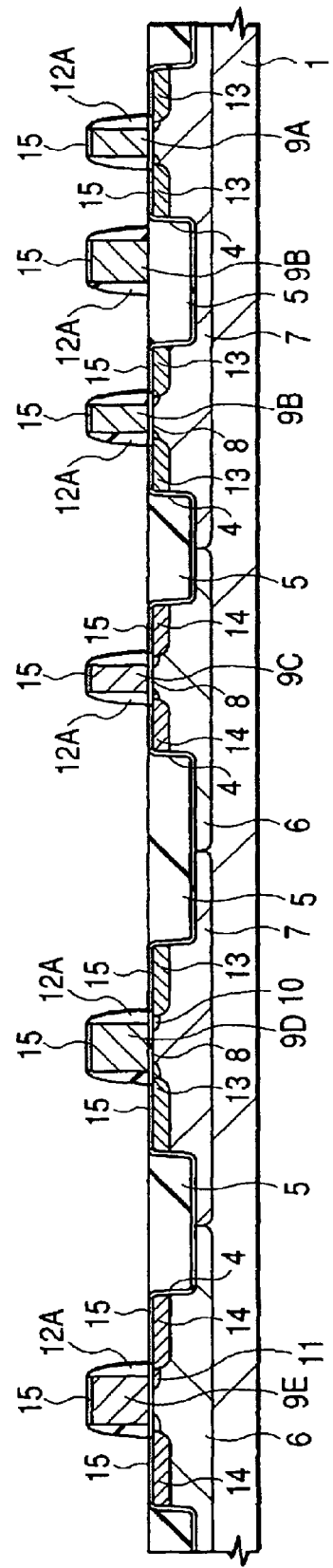
FIG. 16 is a fragmentary cross-sectional view of a semiconductor substrate illustrating the manufacturing method of SRAM according to the one embodiment of the present invention.

As illustrated in FIG. 16, $n^+$ type semiconductor regions (source, drain) 13 of a high impurity concentration are formed by ion implantation of phosphorus or arsenic (As) to the p-type well 7 and $p^+$ type semiconductor regions (source, drain) 14 of a high impurity concentration are formed by ion implantation of boron to the n-type well 6. After removal of the gate oxide film 8 from the surface of each of the $n^+$ type semiconductor regions (source, drain) 13 and $p^+$ type semiconductor regions (source, drain) 14 by wet etching with hydrofluoric acid, a Co film is deposited over the substrate 1 by sputtering, whereby a Co silicide layer 15 is formed over the surface of each of the gate electrodes 9A to 9E, the $n^+$ type semiconductor regions (source, drain) 13 and $p^+$ type semiconductor regions (source, drain) 14 by a silicide reaction due to heat treatment. An unreacted Co film is then removed by wet etching. By the steps so far described, driver MISFET Qd, load MISFET Qp and transfer MISFET Qt are formed in the memory mat, while n channel type MISFET Qa and p channel type MISFET Qb are formed in the peripheral circuit.

Figure 17:
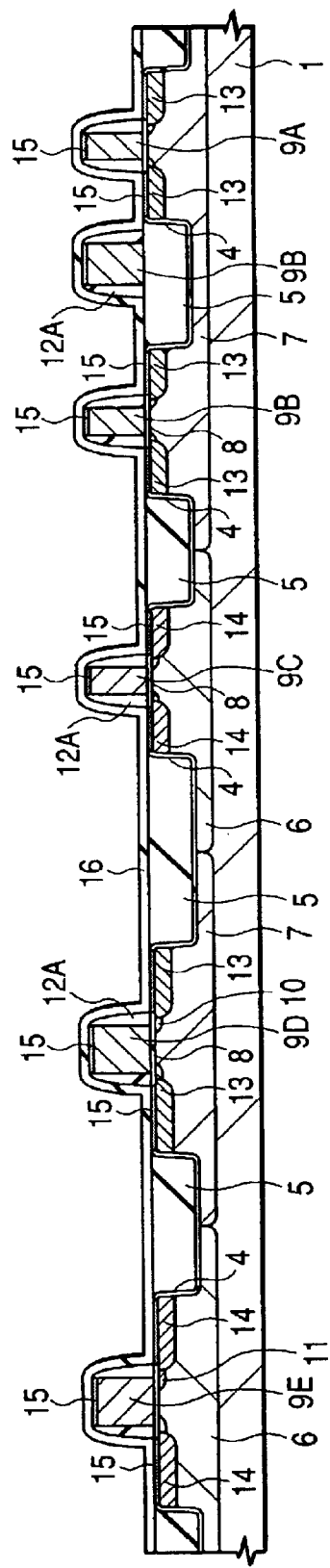
FIG. 17 is a fragmentary cross-sectional view of a semiconductor substrate illustrating the manufacturing method of SRAM according to the one embodiment of the present invention.

As illustrated in FIG. 17, a silicon nitride film 16 of about 50 nm thick is deposited by CVD over the main surface of the substrate 1. For deposition of this silicon nitride film 16, a single-wafer cold-wall thermal CVD reactor 100 as illustrated in FIG. 5 is employed. Film forming conditions are similar to those for the silicon nitride film 12 used for the formation of the above-described side wall spacers 12A. This makes it possible to form the silicon nitride film 16 having a substantially uniform thickness in a high gate-electrode-pattern density region (memory mat) and a low density region (peripheral circuit).

Figure 18:
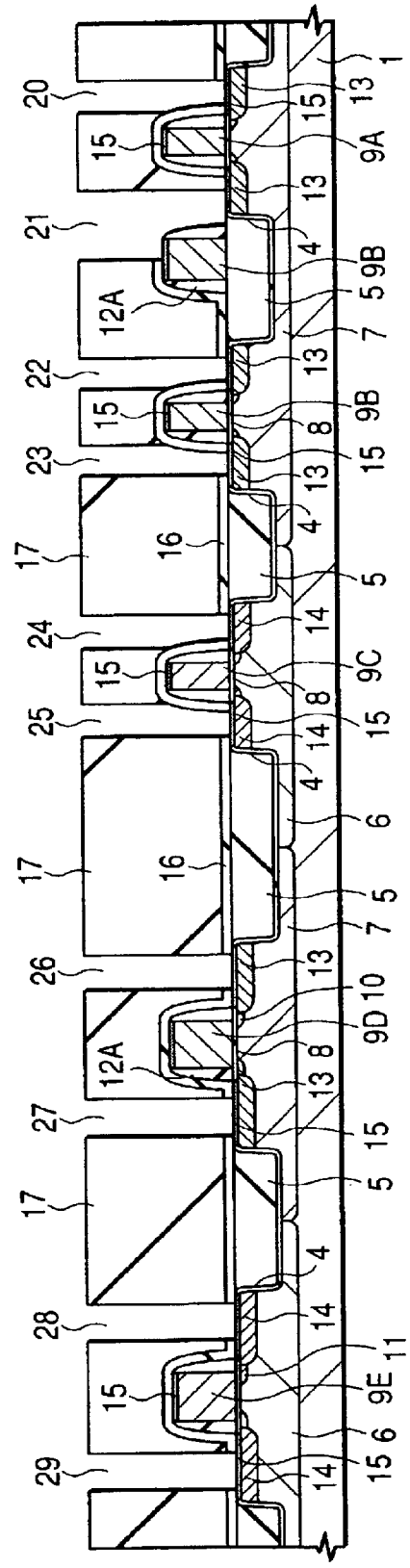
FIG. 18 is a fragmentary cross-sectional view of a semiconductor substrate illustrating the manufacturing method of SRAM according to the one embodiment of the present invention.

As illustrated in FIG. 18, after formation of a silicon oxide film 17 over the silicon nitride film 16 by plasma CVD using, for example, oxygen and tetraethoxysilane as a source gas, the silicon oxide film 17 and silicon nitride film 16 are dry etched successively with a photoresist film (not illustrated) as a mask, whereby contact holes 20 to 29 are formed over the $n^+$ type semiconductor regions (source, drain) 13, the $p^+$ type semiconductor regions (source, drain) 14 and the gate electrode 9B.

The silicon oxide film 17 is dry etched with the silicon nitride film 16 as an etching stopper under the conditions so that the etching rate of the silicon oxide film 17 would be larger than that of the silicon nitride film 16. Etching of the silicon nitride 16 is conducted under the conditions so that its etching rate would be greater than the etching rate of the silicon oxide film 5 embedded in the shallow groove isolation 4. This makes it possible to form the contact holes 20 to 25 of the memory mat in self alignment with the gate electrodes 9A to 9C and shallow groove isolation 4. In this Embodiment, the silicon nitride film 16 is able to have a thickness almost equal in the memory mat and in the peripheral circuit so that the contact holes 20 to 29 can be formed without causing inevitable etching of the silicon oxide film 5 embedded in the shallow groove isolation 4 or substrate 1 in the memory mat.

Figure 19:
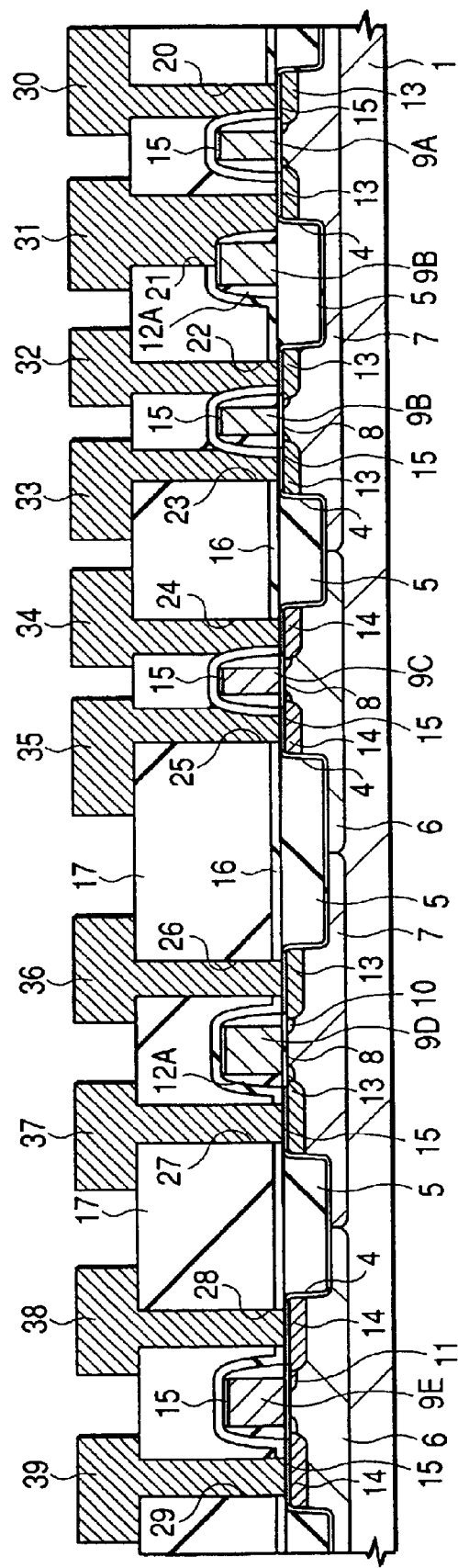
FIG. 19 is a fragmentary cross-sectional view of a semiconductor substrate illustrating the manufacturing method of SRAM according to the one embodiment of the present invention.

As illustrated in FIG. 19, a metal film deposited over the silicon oxide film 17 is patterned to form first-level interconnections 30 to 39.

Embodiment 2

A description will next be made of Second Embodiment of the present invention based on FIGS. 20 to 24 and the above-described FIGS. 1 to 19. Unless another drawing exists or a different description is necessary, details of the description and drawings are substantially similar to those in the above-described embodiment, and in such a case, the description is not repeated here.

As described in the above-described Embodiment, it is important to control a flow rate ratio ($NH_3/SiH_4$) of ammonia to monosilane and film forming pressure in order to increase a thickness ratio of a silicon nitride film in a high pattern density region to a silicon nitride film in a low density region (in other words, to reduce a difference in the thickness of the silicon nitride film). In this Embodiment, this flow rate ratio ($NH_3/SiH_4$) and film forming pressure were investigated in further detail.

Figure 20:
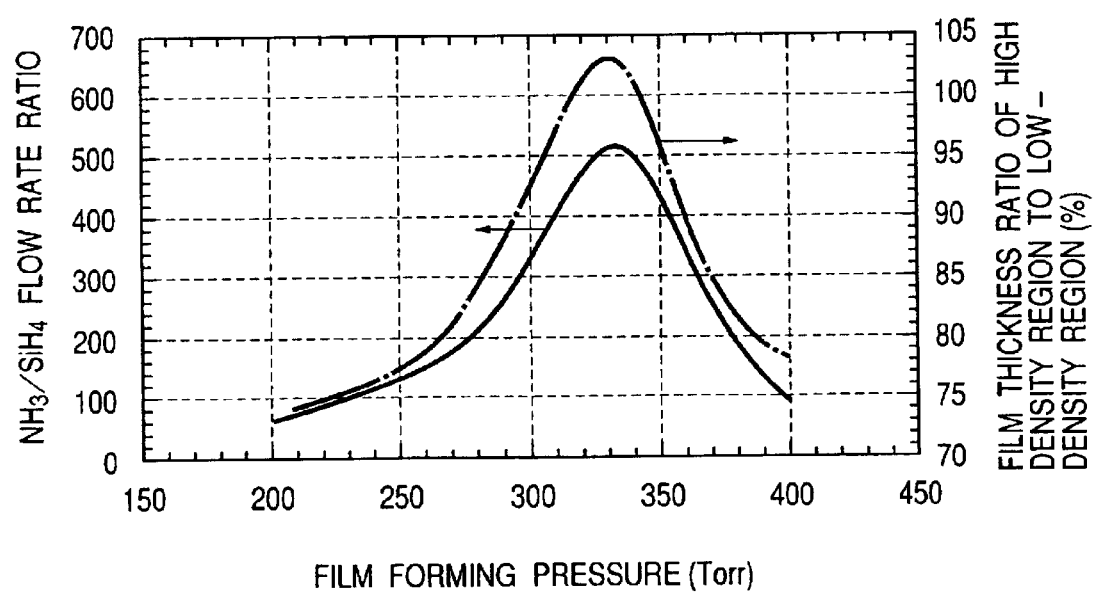
FIG. 20 is a graph showing dependence of a film thickness ratio of a high pattern density region to a low pattern density region on film forming pressure; and dependence, on film formation pressure, of an $NH_3/SiH_4$ flow rate ratio at which the film thickness ratio of a high pattern density region to a low pattern density region shows the maximum value.

FIG. 20 shows the measurement results of the dependence of the above-described film thickness ratio (which will hereinafter be called "film thickness ratio of high density region to low density region") on film forming pressure; and dependence, on film forming pressure, of an $NH_3/SiH_4$ flow rate ratio permitting the maximum film thickness ratio of high density region to low density region at each of film forming pressure.

Figure 21:
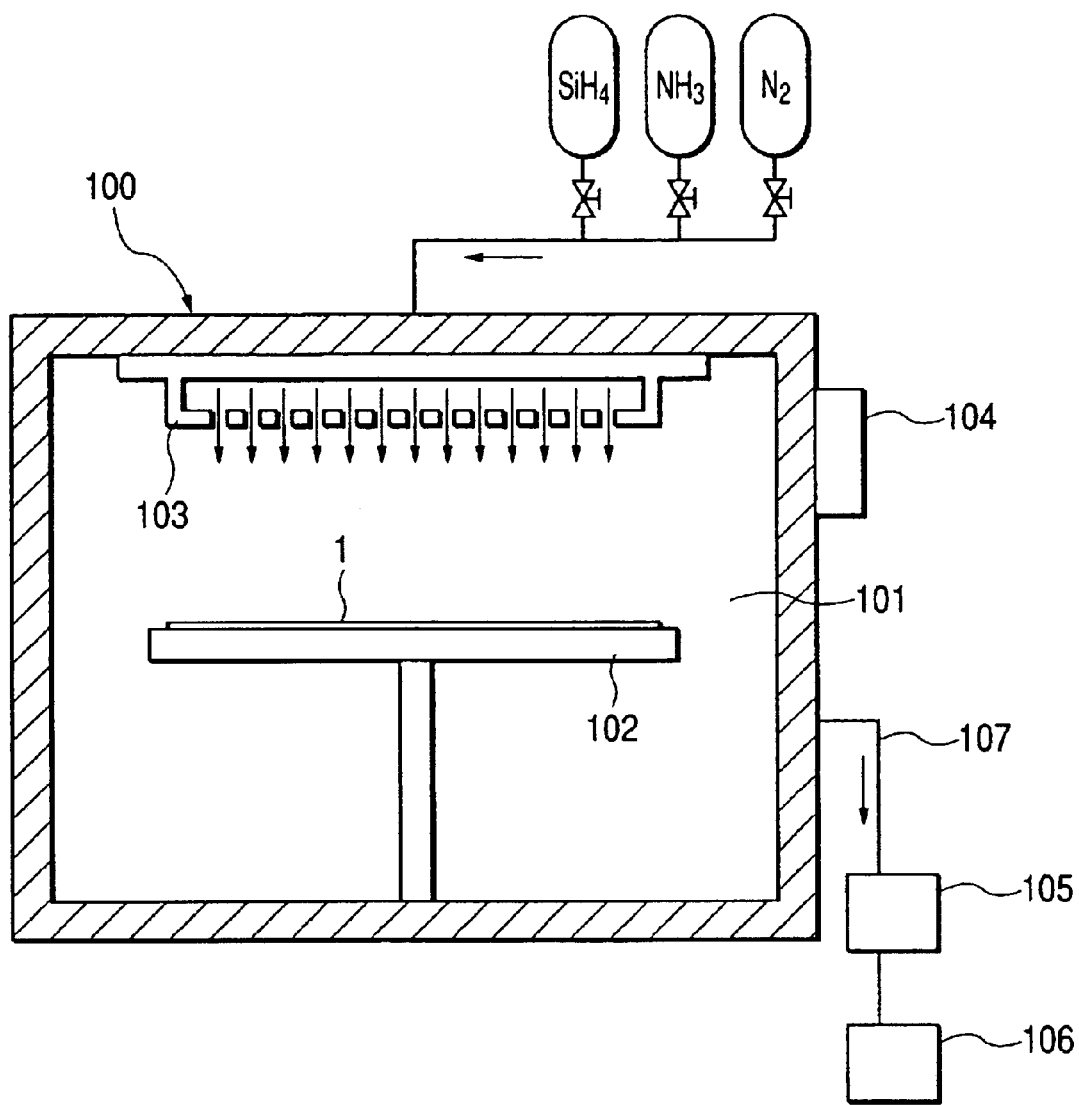
FIG. 21 is a schematic view of a single-wafer cold-wall thermal CVD reactor used for measurement of a film thickness ratio of a high pattern density region to a low pattern density region and dependence of an $NH_3/SiH_4$ flow rate ratio on film forming pressure.

FIG. 21 is a schematic view of a single-wafer cold-wall thermal CVD reactor 100 used in this measurement. This apparatus is basically similar to that illustrated in FIG. 5 of the above-described Embodiment. Its chamber 101 has a volume of about 6 liter. A resistance heating type heater is integrated in the stage 102. On the side wall of the chamber 101, a pressure gage (BARATRON Type 624) 104 for measuring a film forming pressure and an exhaust pipe 107 equipped with a mechanical booster pump 105 and a dry pump 106 are installed. A wafer 1 is a silicon wafer of 20 cm in diameter having gate electrodes (9A to 9E) formed in each of chip regions as illustrated in FIG. 10.

It has been revealed from the diagram of FIG. 20 that a film thickness ratio of high density region to low density region (indicated by a dashed line) and an $NH_3/SiH_4$ flow rate ratio (indicated by a solid line) each has an optimum value within a certain range of a film forming pressure. In other words, it is necessary to control each of the film forming pressure and $NH_3/SiH_4$ flow rate ratio within a predetermined range in order to heighten a film thickness ratio of high density region to low density region to at least a certain value.

Figure 22:
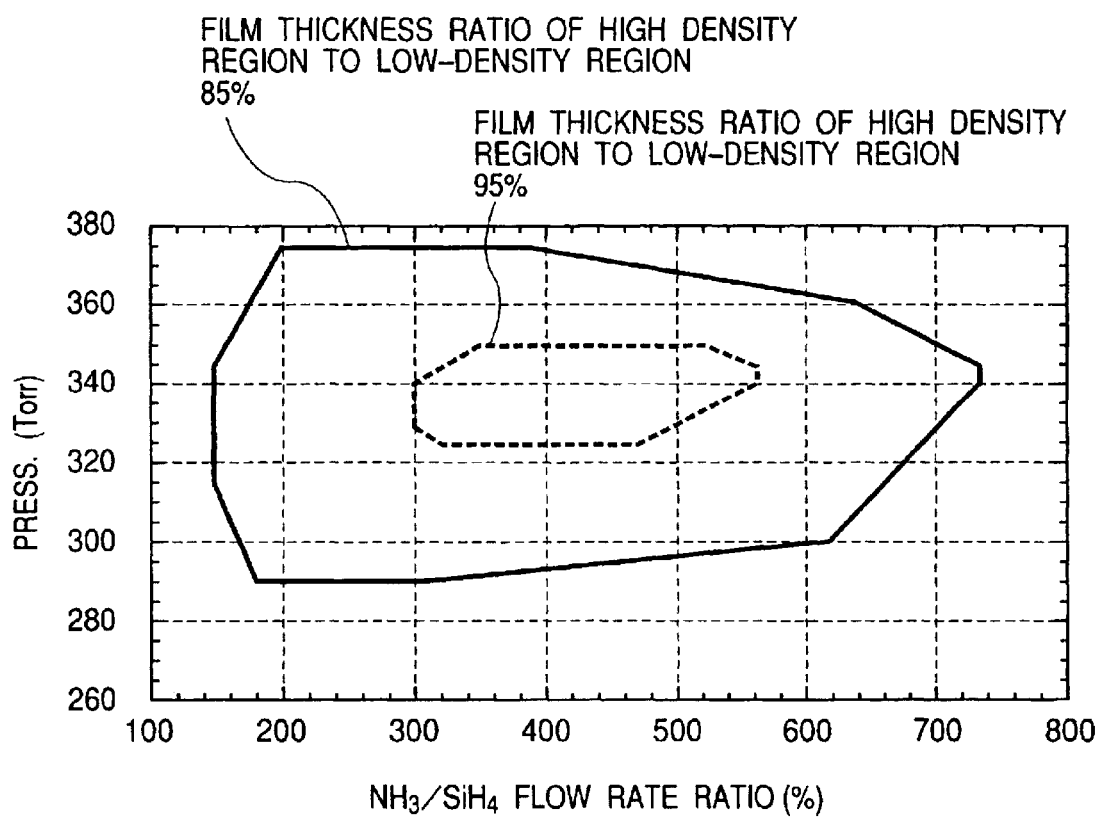
FIG. 22 is a graph showing a two-dimensional distribution of an $NH_3/SiH_4$ flow rate ratio and film forming pressure to control the thickness ratio of a silicon nitride film at a high pattern density region to a low pattern density region to 85% or greater and 95% or greater.

In the next place, detailed measurement results of the conditions which permit a thickness ratio of the silicon nitride film of a high density region to a low density region not less than 85% (a film thickness difference of 15% or less) and not less than 95% (a film thickness difference of 5% or less) are shown in FIG. 22.

Figure 23A:
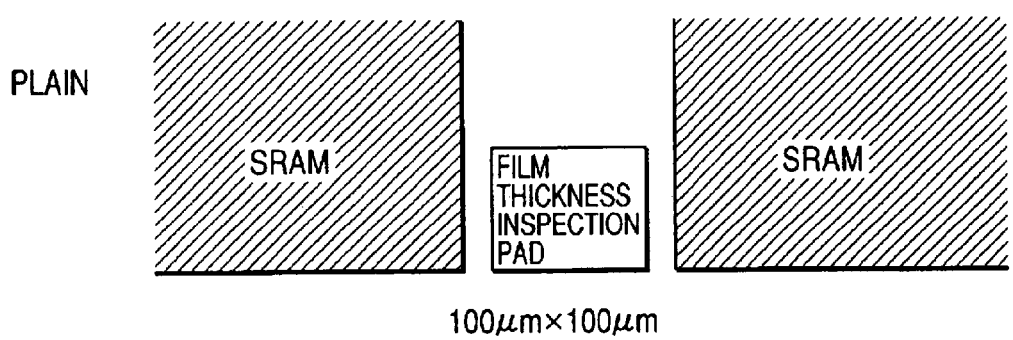
FIG. 23($a$) is a fragmentary enlarged view of a wafer used for measurement of FIG. 22 and FIG. 23($b$) is its cross-sectional view.
Figure 23B:
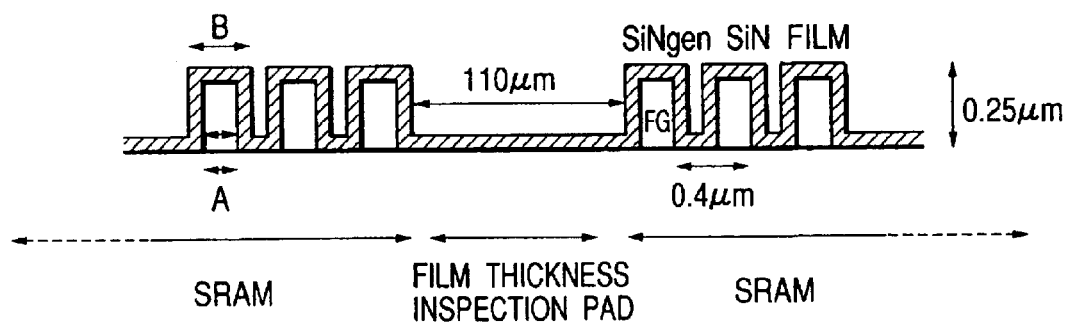
Figure 24:
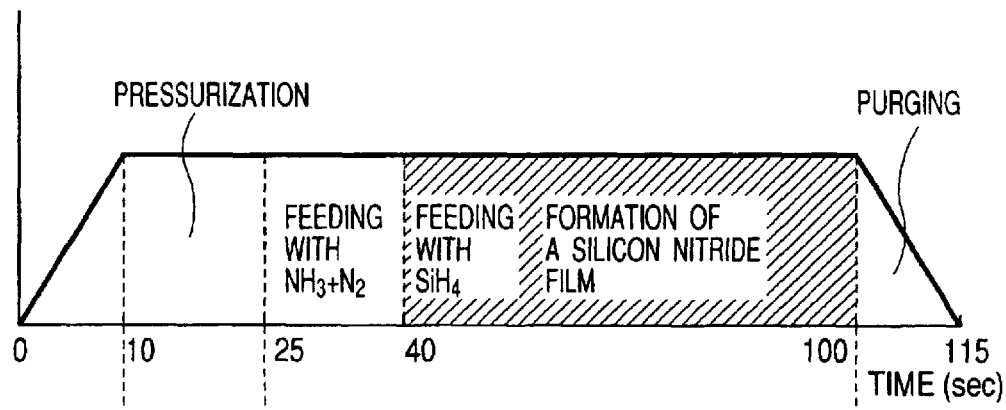
FIG. 24($a$) is a diagram showing feed sequence of a source gas (ammonia+monosilane) used for measurement of FIG. 22 and FIG. 24($b$) is a diagram showing a change in the pressure of the source gas.
Figure 24:
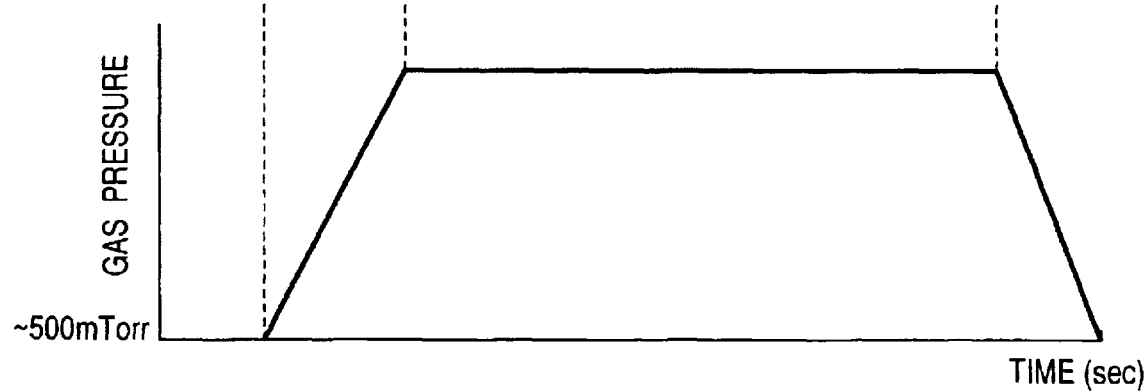

As the wafer, a wafer of 20 cm in diameter having chip regions each divided into blocks as illustrated in FIG. 1 is employed. As illustrated in FIGS. 23(a) and 23(b), gate electrodes are formed in the memory cell of each chip region and in one part of the peripheral circuit, a film thickness inspecting pad having an outside dimension of 100 $\mu$m×100 $\mu$m is formed. The film thickness ratio of high density region to low density region was evaluated by depositing a silicon nitride film of 100 nm thick over this wafer by using a single-wafer cold-wall thermal CVD reactor as illustrated in FIG. 21 and measuring a ratio of the film thickness over the memory array to the film thickness over the film-thickness inspecting pad.

Upon film formation, the temperature of the wafer was set at 750° C. (an appropriate temperature range is usually 650° C. to 800° C., which can be widened to a range of 600° C. to 850° C. by a slight change in the other conditions) and the inside wall temperature of the chamber 101 was set at 30° C. The feeding sequence of a source gas (ammonia+monosilane) under these conditions is shown in FIG. 24(a), while a pressure change of the source gas is shown in FIG. 24(b).

It has been revealed from the measurement results that a film thickness ratio of high density region to low density region becomes 85% or greater by setting the $NH_3/SiH_4$ flow rate ratio to fall within a range of about 150 to 750 and a film forming pressure to fall within a range of about 37 kPa (280 Torr) to about 50 kPa (380 Torr). It has also been revealed that the film thickness ratio of high density region to low density region becomes greater, in other words, the film becomes more uniform by setting the $NH_3/SiH_4$ flow rate ratio to fall preferably within a range of about 200 to 650, more preferably within a range of about 300 to 550, and setting the film forming pressure to fall preferably within a range of about 39 kPa (295 Torr) to about 49 kPa (365 Torr), more preferably within a range of about 41 kPa (310 Torr) to about 47 kPa (350 Torr). Especially, it is possible to increase the film thickness ratio of high density region to low density region to 95% or greater by setting the $NH_3/SiH_4$ flow rate ratio at about 450 and the film forming pressure at 44 kPa (330 Torr).

The above-described optimum range for each of the film forming pressure and $NH_3/SiH_4$ flow rate ratio can be applied not only to a wafer of 20 cm in diameter but also a wafer of another size. It should be noted that the surface area changes, depending on the size of the wafer so that a flow rate of a source gas must be increased or decreased depending on the surface area. For example, a wafer of 30 cm in diameter has a surface area of 2.25 times larger than that of a wafer of 20 cm in diameter so that the flow rate of a source gas must be increased to 2.25 times. A change in each of the film forming pressure and $NH_3/SiH_4$ flow rate ratio is not required.

A single-wafer cold-wall thermal CVD reactor used for the formation of a silicon nitride film is not limited to that illustrated in FIG. 21 but a modified one in details can be used insofar as it does not depart from the subject matter of the present invention. For example, in the reactor illustrated in FIG. 21, a wafer is heated by a resistance heating type heater integrated in the stage 102, but it may be heated by a lamp heating system. The lamp heating system is superior in temperature increasing or decreasing characteristics to the resistance heating system. The resistance heating system is, on the other hand, characterized by less contamination from a heat source compared with the lamp heating system.

The present invention made by present inventors was so far described specifically based on some embodiments. It should however be borne in mind that the present invention is not limited to or by these embodiments, but can be changed without departing from the subject matter of the invention.

In the above-described embodiments, a nitrogen gas is employed as a carrier gas or diluting gas. An inert gas such as argon may be used instead of it or as a part of it. In the gas atmosphere, not only a reactant gas such as source gas, a carrier gas and a dilution gas but also another additive gas can be incorporated.

With regards to the pressure of the gas atmosphere, in addition to a sub-atmospheric reduced pressure region as exemplified in Embodiments 1 and 2, an atmospheric pressure region or a sub-atmospheric pressurized region, which is expected to bring about a merit in a film forming velocity or the like, is usable, though it requires countermeasures for safety.

In the first Embodiment, the present invention was applied to the manufacture of SRAM, but it is not limited thereto but can be applied to any semiconductor integrated circuit device having a step of depositing, by thermal CVD, a silicon nitride film over a semiconductor wafer having, in each chip region, a low pattern density region and a high pattern density region.

Among the inventions disclosed by the present application, advantages available by the typical ones will next be described simply.

The present invention makes it possible to deposit a silicon nitride film with uniform thickness over the main surface of a semiconductor wafer having a high pattern density region and a low pattern density region.

What is claimed is:

1. A manufacturing method of a semiconductor integrated circuit device comprising feeding a source gas containing a monosilane gas and an ammonia gas to the vicinity of a main surface of a semiconductor wafer heated to a temperature not less than a thermal decomposition temperature of said monosilane gas and said ammonia gas in a thermal CVD reactor, and decomposing said monosilane gas and said ammonia gas in the vicinity of the main surface of said semiconductor wafer with said reactor operating under cold-wall thermal CVD conditions, thereby depositing a silicon nitride film by cold-wall thermal CVD over the main surface of said semiconductor wafer placed in a gas atmosphere containing said monosilane gas and said ammonia gas, wherein a flow rate ratio of said ammonia gas to said monosilane gas is within a range of 150 to 750 and a pressure of said gas atmosphere is within a range of 37 kPa to 50 kPa.

2. A method according to claim 1, wherein a flow rate ratio of said ammonia gas to said monosilane gas is within a range of 200 to 650 and a pressure of said gas atmosphere is within a range of 39 kPa to 49 kPa.

3. A method according to claim 1, wherein a flow rate ratio of said ammonia gas to said monosilane gas is within a range of 300 to 550 and a pressure of said gas atmosphere is within a range of 41 kPa to 47 kpa.

4. A method according to claim 1, wherein the main surface of said semiconductor substrate is divided into at least one chip region and each said chip region has a low pattern density region and a high pattern density region.

5. A method according to claim 1, wherein said reactor is a single-wafer thermal CVD reactor.

6. A method according to claim 5, wherein said flow rate ratio of said ammonia gas to said monosilane gas is within a range of 200 to 650 and a pressure of said gas atmosphere is within a range of 39 kPa to 49 kPa.

7. A method according to claim 6, wherein said wafer has a diameter of at least 200 mm.

8. A method according to claim 5, wherein a flow rate ratio of said ammonia gas to said monosilane gas is within a range of 300 to 550 and a pressure of said gas atmosphere is within a range of 41 kPa to 47 kPa.

9. A method according to claim 8, wherein said wafer has a diameter of at least 200 mm.

10. A method according to claim 5, wherein said wafer has a diameter of at least 200 mm.

* * * * *